United States Patent
Lee et al.

(10) Patent No.: US 12,035,462 B2
(45) Date of Patent: Jul. 9, 2024

(54) ELECTRONIC DEVICE AND PRINTED CIRCUIT BOARD INCLUDING STRUCTURE FOR REMOVING ELECTRICAL STRESS

(71) Applicant: Samsung Electronics Co., Ltd., Suwon-si (KR)

(72) Inventors: Hongkyu Lee, Suwon-si (KR); Hyoseok Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 217 days.

(21) Appl. No.: 17/559,204

(22) Filed: Dec. 22, 2021

(65) Prior Publication Data

US 2022/0201846 A1    Jun. 23, 2022

Related U.S. Application Data

(63) Continuation of application No. PCT/KR2021/019176, filed on Dec. 16, 2021.

(30) Foreign Application Priority Data

Dec. 18, 2020 (KR) ........................ 10-2020-0178131

(51) Int. Cl.
*H04R 1/04*    (2006.01)
*H04R 1/08*    (2006.01)
(Continued)

(52) U.S. Cl.
CPC ............. *H05K 1/0259* (2013.01); *H04R 1/04* (2013.01); *H04R 1/086* (2013.01); *H04R 3/00* (2013.01); *H04R 19/04* (2013.01); *H05K 1/115* (2013.01); *H05K 1/141* (2013.01); *H05K 1/144* (2013.01); *H04R 2201/003* (2013.01);
(Continued)

(58) Field of Classification Search
None
See application file for complete search history.

(56) References Cited

U.S. PATENT DOCUMENTS 8,175,299 B2    5/2012  Song et al.
2008/0144874 A1    6/2008  Wu et al.
(Continued)

FOREIGN PATENT DOCUMENTS

JP    2005-086231 A    3/2005
KR    20-0264935 Y1    2/2002
(Continued)

OTHER PUBLICATIONS

"Via (electronics)." Wikipedia, Sep. 28, 2020, en.wikipedia.org/wiki/Via_(electronics). (Year: 2020).*
(Continued)

*Primary Examiner* — James K Mooney
(74) *Attorney, Agent, or Firm* — Jefferson IP Law, LLP

(57) ABSTRACT

An electronic device is provided. The electronic device includes a printed circuit board (PCB) on which a plurality of PCBs is stacked and comprising a hole penetrating the plurality of PCBs, a microphone disposed on a first surface of the PCB and to which a sound is delivered through the hole, and an electrical conductive path formed in at least a part of or the entire hole. The electrical conductive path may be electrically connected to at least one of a ground of the PCB or a ground of the microphone.

20 Claims, 24 Drawing Sheets

(51) Int. Cl.
     *H04R 3/00*          (2006.01)
     *H04R 19/04*        (2006.01)
     *H05K 1/02*          (2006.01)
     *H05K 1/11*          (2006.01)
     *H05K 1/14*          (2006.01)

(52) U.S. Cl.
     CPC .... *H04R 2499/11* (2013.01); *H05K 2201/041* (2013.01); *H05K 2201/042* (2013.01); *H05K 2201/10151* (2013.01)

(56) References Cited

U.S. PATENT DOCUMENTS

| | | |
|---|---|---|
| 2018/0098143 A1 | 4/2018 | Silvestri et al. |
| 2018/0376039 A1 | 12/2018 | Sanford et al. |
| 2020/0059722 A1 | 2/2020 | Fang |
| 2020/0266151 A1 * | 8/2020 | Chen ...................... H01L 23/13 |

FOREIGN PATENT DOCUMENTS

| | | | |
|---|---|---|---|
| KR | 10-2020-0109903 A | 9/2020 | |
| WO | 2020/208481 A1 | 10/2020 | |
| WO | WO-2020208481 A1 * | 10/2020 | ............... A61N 1/08 |

OTHER PUBLICATIONS

International Search Report dated Mar. 21, 2022, issued in International Application No. PCT/KR2021/019176.

* cited by examiner

ELECTRONIC DEVICE AND PRINTED CIRCUIT BOARD INCLUDING STRUCTURE FOR REMOVING ELECTRICAL STRESS

CROSS-REFERENCE TO RELATED APPLICATION(S)

This application is a continuation application, claiming priority under § 365(c), of an International application No. PCT/KR2021/019176, filed on Dec. 16, 2021, which is based on and claims the benefit of a Korean patent application number 10-2020-0178131, filed on Dec. 18, 2020, in the Korean Intellectual Property Office, the disclosure of which is incorporated by reference herein in its entirety.

TECHNICAL FIELD

The disclosure relates to an electronic device and printed circuit board including a structure for removing electrical stress.

BACKGROUND ART

With the development of digital technology, various types of electronic devices, such as a mobile communication terminal, a personal digital assistant (PDA), an electronic notebook, a smartphone, a tablet personal computer (PC), and a wearable device, are widely used.

Recently, an electronic device may include a camera in order to provide a user with various image photographing functions and a photo having high picture quality, and may have improved sound source collection performance because a microphone is disposed around the camera.

The above information is presented as background information only to assist with an understanding of the disclosure. No determination has been made, and no assertion is made, as to whether any of the above might be applicable as prior art with regard to the disclosure.

DISCLOSURE

Technical Problem

A microphone and/or an electronic circuit exposed to the outside of an electronic device have a problem in that they are exposed to electrical stress, such as static electricity.

Aspects of the disclosure are to address at least the above-mentioned problems and/or disadvantages and to provide at least the advantages described below. Accordingly, an aspect of the disclosure is to provide an electronic device and printed circuit board including a structure for removing electrical stress according to various embodiments can form an extended ground path in a part of or the entire microphone hole.

Additional aspects will be set forth in part in the description which follows and, in part, will be apparent from the description, or may be learned by practice of the presented embodiments.

Technical Solution

In accordance with another aspect of the disclosure, an electronic device is provided. The electronic device includes a printed circuit board (PCB) on which a plurality of PCBs is stacked and comprising a hole penetrating the plurality of PCBs, a microphone disposed on a first surface of the PCB and to which a sound is delivered through the hole, and an electrical conductive path formed in at least a part of or the entire hole. The electrical conductive path may be electrically connected to at least one of a ground of the PCB or a ground of the microphone.

A PCB according to various embodiments includes a board on which a plurality of PCBs is stacked, a hole penetrating the board, an electrical conductive path formed in at least a part of or the entire hole, and a ground formed in the board. The electrical conductive path may be electrically connected to the ground.

Advantageous Effects

The electronic device according to various embodiments can secure the mounting space of the electronic device because an extended ground path is formed in a part of or the entire microphone hole.

The electronic device according to various embodiments can remove noise attributable to electrical stress occurring outside the electronic device because an extended ground path is included in a part of or the entire microphone hole.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR DISCLOSURE

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
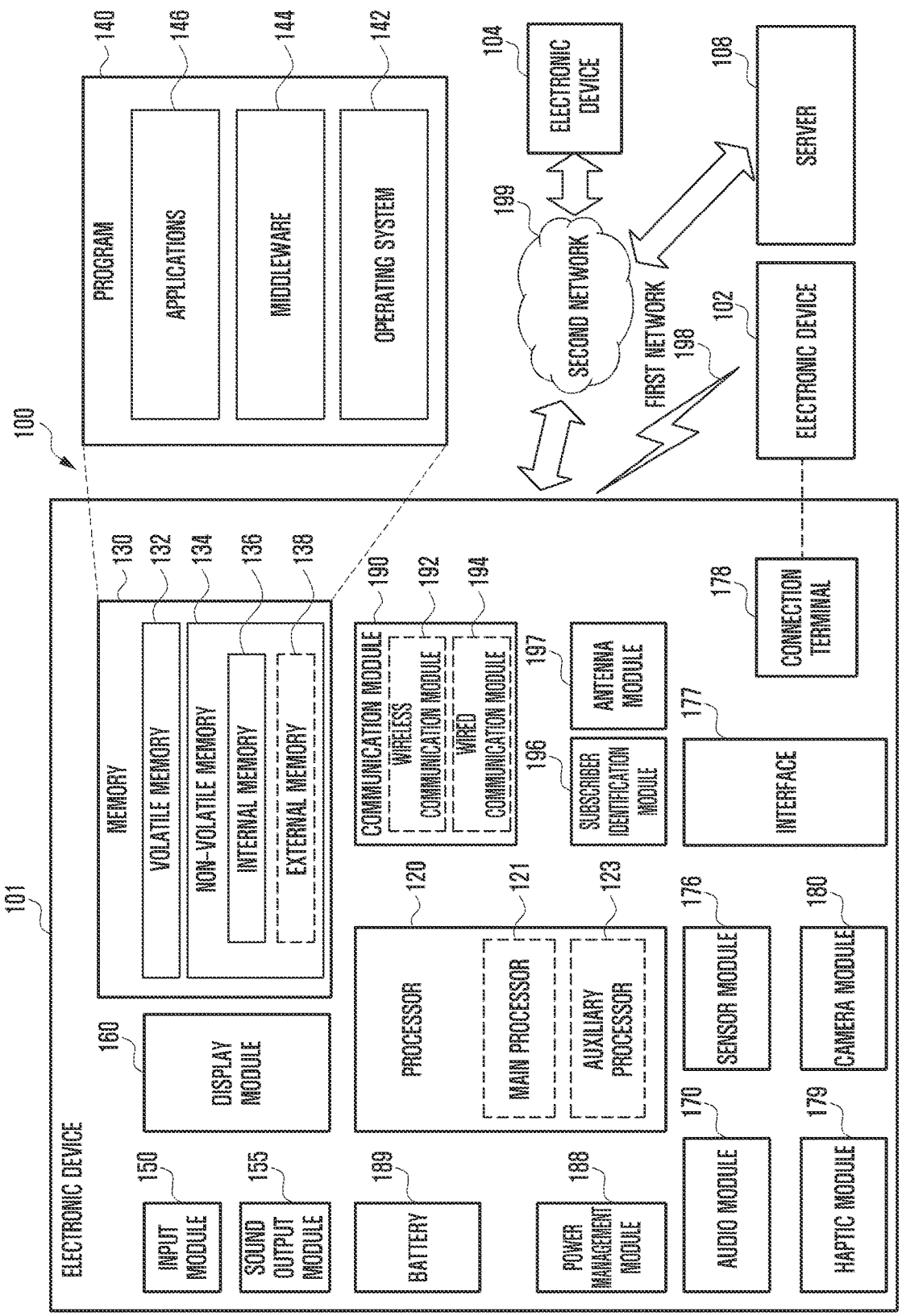
FIG. 1 is a block diagram of an electronic device within a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
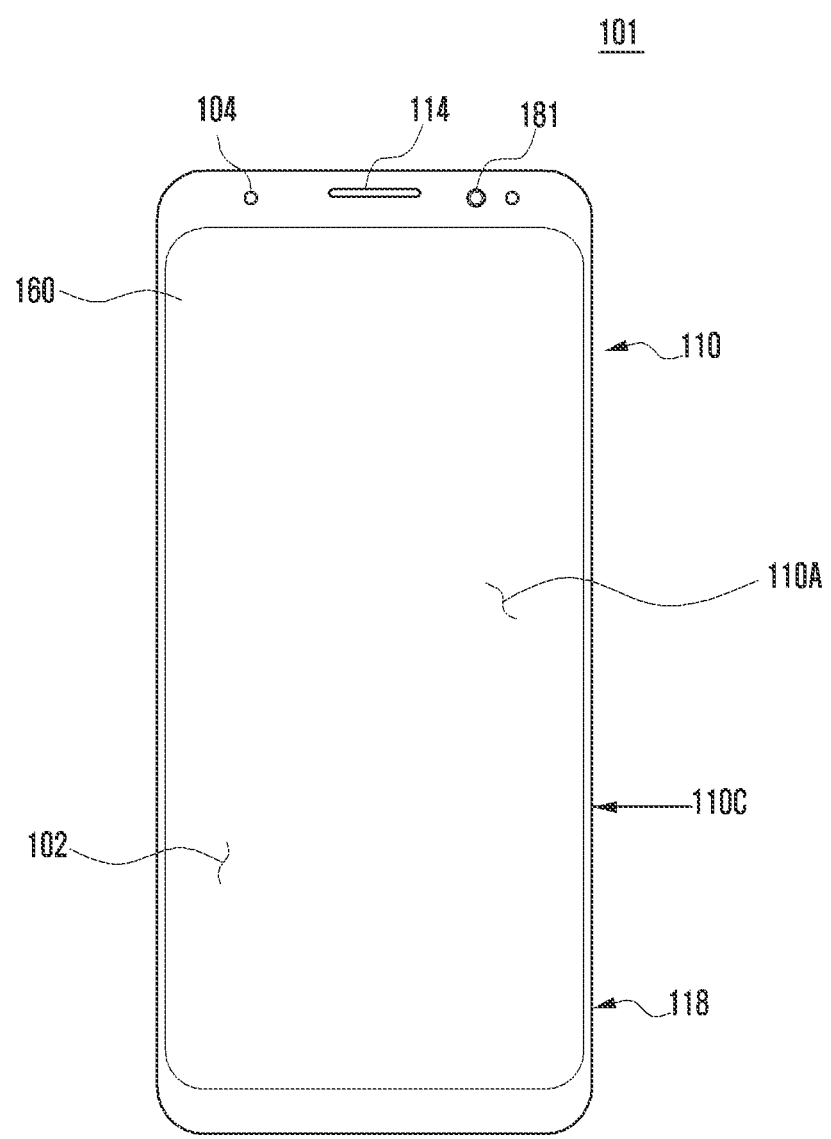
FIG. 2A is a front view of the electronic device according to an embodiment of the disclosure.
Figure 2B:
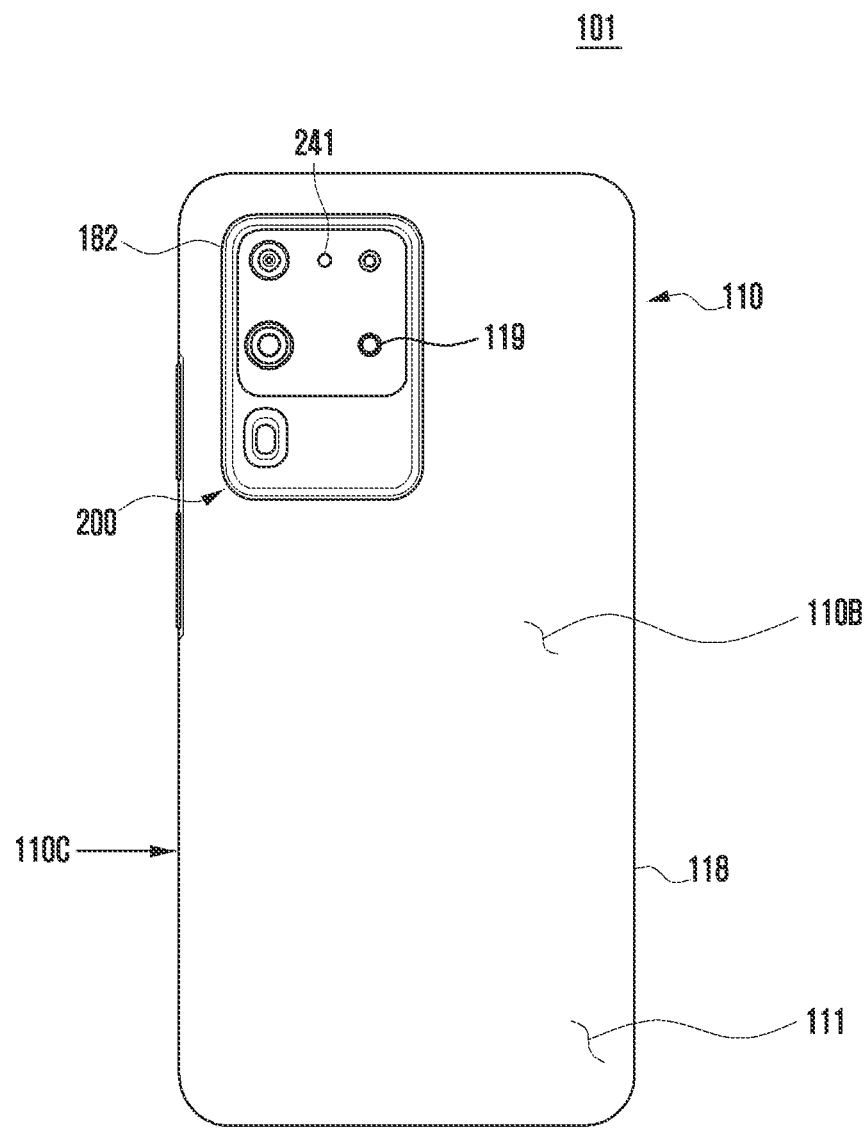
FIG. 2B is a rear view of the electronic device in FIG. 2A according to an embodiment of the disclosure.

FIG. 2A is a front view of the electronic device 101 according to an embodiment of the disclosure. FIG. 2B is a rear view of the electronic device 101 in FIG. 2A according to an embodiment of the disclosure.

Referring to FIGS. 2A and 2B, the electronic device 101 may include a housing 110, including a first surface (or a front) 110A, a second surface (or a rear) 110B, and a side 110C surrounding a space between the first surface 110A and the second surface 110B. In another embodiment (not illustrated), a housing may refer to a structure that forms some of the first surface 110A, the second surface 110B and the side 110C in FIG. 1. The first surface 110A may be formed by a front plate 102 (e.g., a glass plate or a polymer plate including various coating layers) at least a part of which is substantially transparent. The second surface 110B may be formed by a rear plate 111 that is substantially opaque. The rear plate 111 may be formed by coated or colored glass, ceramic, polymer, metal (e.g., aluminum, stainless steel (STS) or magnesium), or a combination of at least two of the materials. The side 110C may be combined with the front plate 102 and the rear plate 111, and may be formed by a side bezel structure (or a "side member") 118 composed of metal and/or polymer. The rear plate 111 and the side bezel structure 118 may be integrated, and may include the same material (e.g., a metal material such as aluminum).

The electronic device 101 may include at least one of the display module 160, the sensor module 104 and 119, a microphone hole 241, a speaker hole 114 and camera module 181 and 182. The electronic device 101 may additionally include a key input device or an indicator.

The display module 160 may be exposed through most part of the front plate 102. The display module 160 may be coupled with a touch sensing circuit, a pressure sensor capable of measuring the intensity (pressure) of a touch and/or a digitizer for detecting a stylus pen using a magnetic field method or may be disposed to be adjacent thereto.

The microphone hole 241 may have a microphone for obtaining an external sound disposed therein. In an embodiment, a plurality of microphones may be disposed in the microphone hole 241 so that the direction of a sound can be detected.

The speaker hole 114 may include an external speaker hole and a receiver hole 114 for a call. In an embodiment, the speaker hole 114 and the microphone hole 241 may be implemented as one hole or a speaker (e.g., a piezo speaker) may be included without the speaker hole 114.

The sensor module 104 and 119 may generate an electrical signal or a data value corresponding to an internal operating state or external environment state of the electronic device 101. The sensor module 104 and 119 may include a first sensor module 104 (e.g., a proximity sensor) disposed on the first surface 110A of the housing 110 and/or a second sensor module (not illustrated) (e.g., a fingerprint sensor) and/or a third sensor module 119 (e.g., an HRM sensor) disposed on the second surface 110B of the housing 110. The electronic device 101 may further include at least one of sensor modules not illustrated, for example, a gesture sensor, a gyro sensor, an atmosphere sensor, a magnetic sensor, an acceleration sensor, a grip sensor, a color sensor, an infrared (IR) sensor, a bio sensor, a temperature sensor, a humidity sensor, or an illuminance sensor.

The camera module 181 and 182 may include a first camera module 181 disposed on the first surface 110A of the electronic device 101 and a second camera module 182 and/or a flash disposed on the second surface 110B.

A camera window 200 may protect the second camera module 182 and the microphone hole 241. In the electronic device 101, the microphone hole 241 may be disposed near the second camera module 182 and the second camera module 182. The electronic device 101 can improve sound source collection performance corresponding to video and an image obtained through the second camera module 182 because the microphone hole 241 is disposed around the second camera module 182.

The camera module 181 and 182 may include one or a plurality of lenses, image sensors and/or image signal processors. The flash may include a light-emitting diode or a xenon lamp. In an embodiment, two or more lenses (a wide angle and a telephoto lens) and image sensors may be disposed on one surface of the electronic device 101.

The microphone hole 241 may be included in the input module 150 in FIG. 1, but the disclosure is not limited thereto. The speaker hole 114 may be included in the sound output module 155 in FIG. 1, but the disclosure is not limited thereto.

Figure 3:
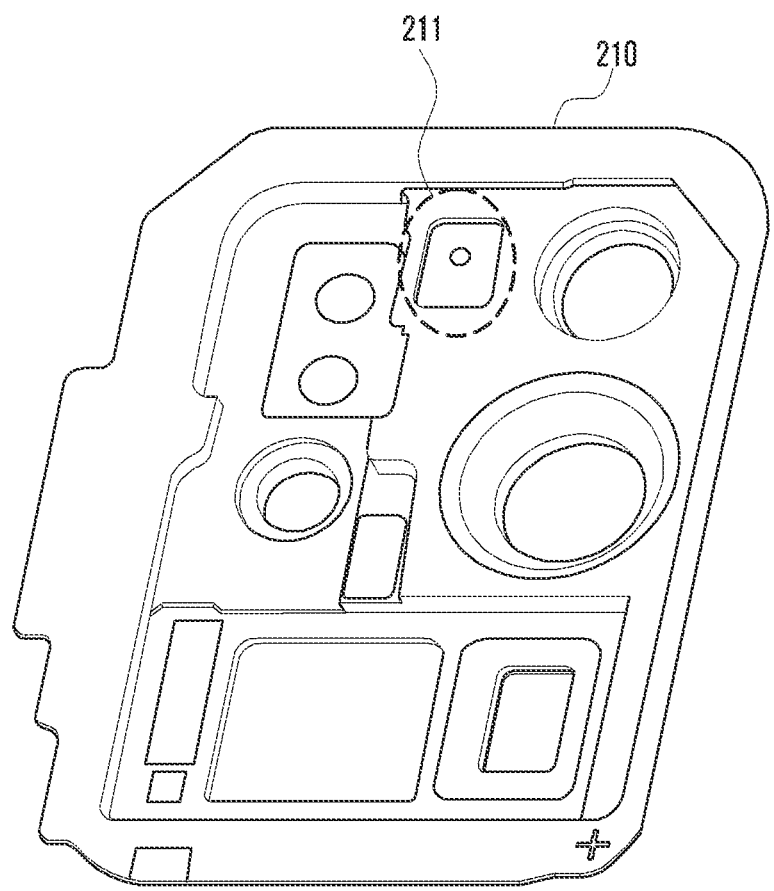
FIG. 3 is a diagram illustrating a camera assembly according to an embodiment of the disclosure.

FIG. 3 is a diagram illustrating a camera assembly 210 according to an embodiment of the disclosure.

The camera assembly 210 may be a camera decoration. Referring to FIGS. 2B and 3, the camera assembly 210 may be at least partially disposed under the camera window 200 disposed on the second surface 110B.

The camera assembly 210 functions as a support member so that the second camera module 182 and/or a microphone module (e.g., a microphone 520 in FIG. 5) are supported by the electronic device 101. The camera assembly 210 may decorate an outward appearance of the second camera module 182.

Referring to FIGS. 2B and 3, the camera assembly 210 may include a microphone coupling structure 211 at a location corresponding to the microphone hole 241.

Figure 4A:
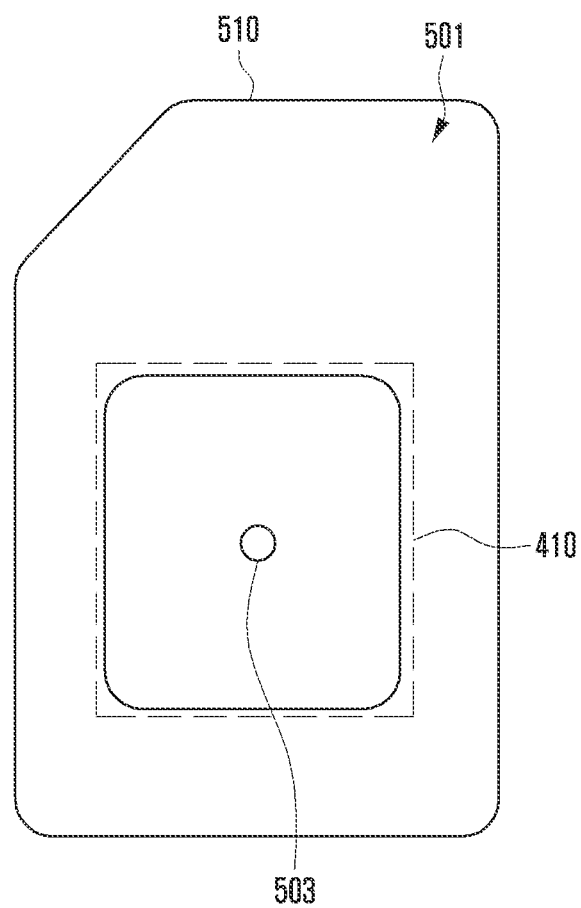
FIG. 4A is a diagram illustrating a microphone module disposed on a first surface of a printed circuit board (PCB) according to an embodiment of the disclosure.

FIG. 4A is a diagram illustrating a microphone module 410 disposed on a first surface 501 of a PCB 510 according to an embodiment of the disclosure.

Figure 4B:
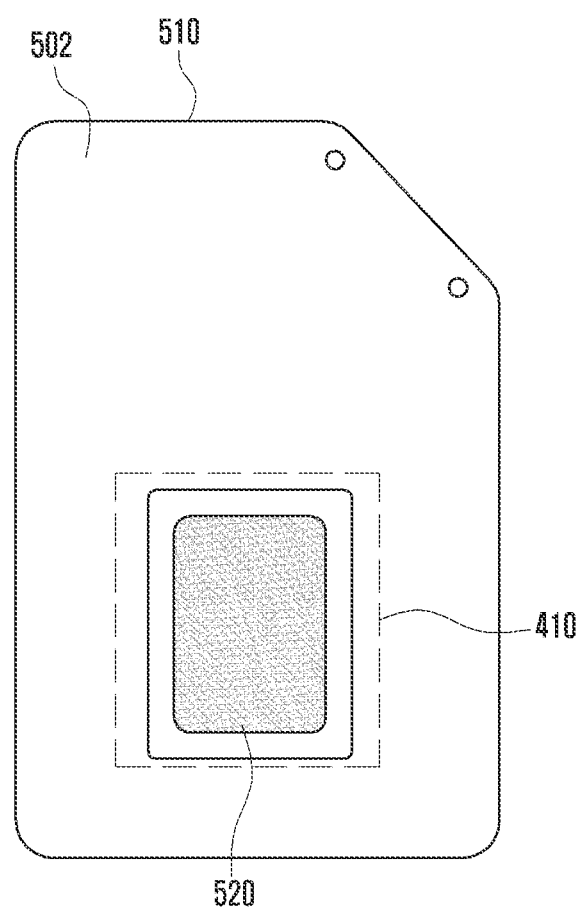
FIG. 4B is a diagram illustrating a microphone module disposed on a second surface of a PCB according to an embodiment of the disclosure.

FIG. 4B is a diagram illustrating the microphone module 410 disposed on a second surface 502 of the PCB 510 according to an embodiment of the disclosure.

Referring to FIGS. 4A and 4B, the microphone module 410 may include a hole 503 in at least a part of the first surface 501 of the PCB 510. In the microphone module 410, the microphone 520 may be disposed on at least a part of the second surface 502 of the PCB 510.

Figure 4C:
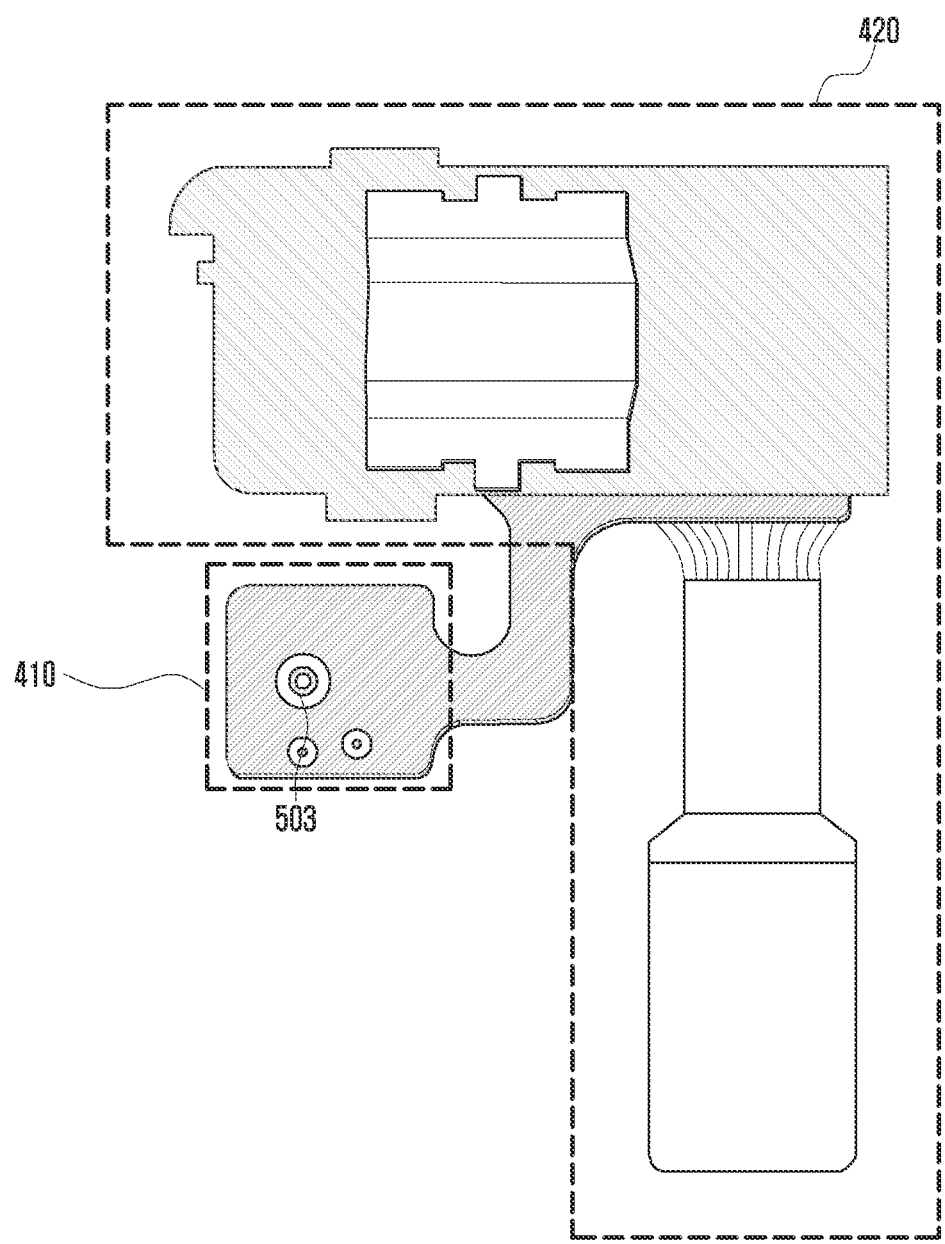
FIG. 4C is a diagram illustrating a microphone and connector of an electronic device according to an embodiment of the disclosure.

FIG. 4C is a diagram illustrating the microphone module 410 and connector 420 of the electronic device 101 according to an embodiment of the disclosure.

Referring to FIG. 4C, the electronic device 101 may include the microphone module 410 and the connector 420. The microphone module 410 may include a PCB (e.g., a PCB 510 in FIG. 5) and a microphone (e.g., a microphone 520 in FIG. 5). The connector 420 may transmit, to another element (e.g., the processor 130 and/or the memory 130) of the electronic device 101, sound information electrically converted through the microphone module 410. The connector 420 may further include a flexible printed circuit board (FPCB).

Referring to FIGS. 3 and 4A to 4C, the microphone module 410 may include the hole 503 corresponding to the microphone hole 241, and may include a shape which may be coupled with the microphone coupling structure 211.

Figure 5:
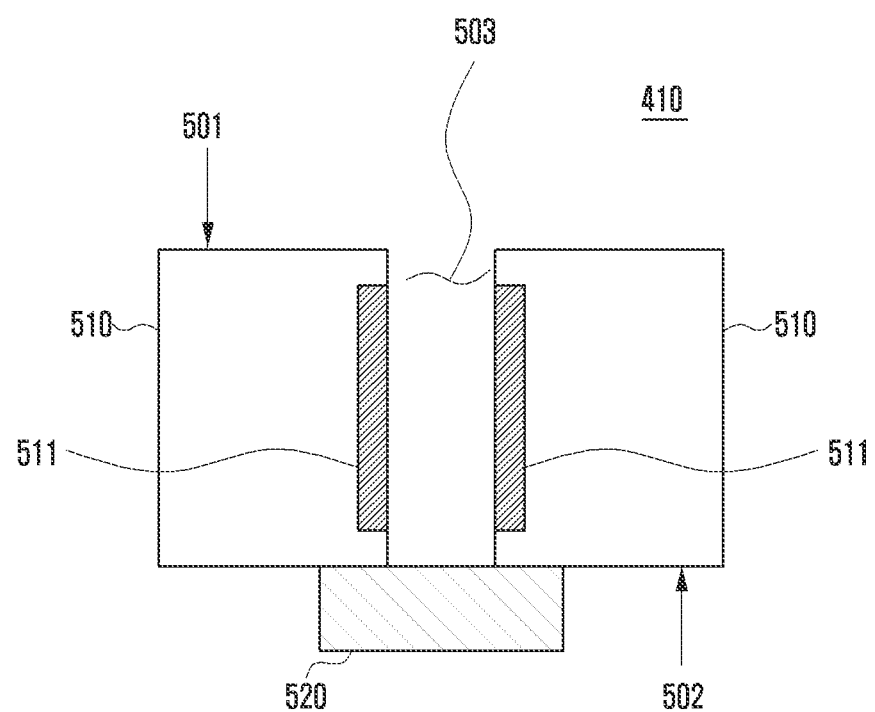
FIG. 5 is a diagram illustrating a cross-sectional view of a microphone according to an embodiment of the disclosure.

FIG. 5 is a diagram illustrating a cross-sectional view of a microphone module according to an embodiment of the disclosure.

Referring to FIG. 5, the microphone module 410 may include the PCB 510 and the microphone 520.

The PCB 510 (e.g., a printed circuit board (PCB), a printed board assembly (PBA), a flexible PCB (FPCB) or a rigid-flexible PCB (RFPCB)) may include at least one PCB.

The PCB 510 may be a PCB having a multilayer and/or stacked layer structure formed by stacking a plurality of PCBs.

The PCB 510 may include a first surface 501 of the PCB 510 and a second surface 502 of the PCB 510.

The first surface 501 of the PCB 510 may be coupled with the microphone coupling structure 211. A shape of the first surface 501 and a shape of the microphone coupling structure 211 may be identical with each other so that the first surface 501 of the PCB 510 is coupled with the microphone coupling structure 211. When the first surface 501 of the PCB 510 is coupled with the microphone coupling structure 211, a buffer member and/or a sound leakage preventing member (e.g., rubber) may be disposed between the first surface 501 of the PCB 510 and the microphone coupling structure 211.

The first surface 501 of the PCB 510 may be coupled with the camera assembly 210.

A buffer member may be disposed on the first surface 501 of the PCB 510. The buffer member may be disposed between the first surface 501 of the PCB 510 and a camera window (e.g., the camera window 200 in FIG. 2B).

The microphone 520 may be disposed on the second surface 502 of the PCB 510. The PCB 510 may include the hole 503. The hole 503 of the PCB 510 may deliver, to the microphone 520, a sound delivered from the outside of the electronic device 101.

The hole 503 of the PCB 510 is a hole that passes through at least a part of the PCB 510 on which a plurality of PCBs is stacked. An entrance (or exit) of the hole is opened. A microphone sensor (e.g., a micro electromechanical system (MEMS) microphone sensor) may be disposed at an entrance (or a hole) placed on a side opposite to the opened entrance (or exit).

The microphone 520 may convert, into an electrical signal, a sound delivered through the hole 503 of the PCB 510. The microphone 520 may include a microphone sensor and may be protected using a protection member. The microphone sensor is an acoustic transducer, and may be an MEMS acoustic transducer, for example. The protection member is a shielding and blocking structure, and may be a shield can structure surrounding the microphone sensor, for example. The protection member may be a metal protection member and may be a conductive protection member.

Referring to FIG. 5, the PCB 510 may include an electrical conductive path 511. The electrical conductive path 511 may be formed in at least a part of the hole 503 of the PCB 510. The electrical conductive path 511 may be formed by plating and/or depositing a conductive material (e.g., copper) on the hole 503 of the PCB 510.

The electrical conductive path 511 may be formed by etching a part of the PCB 510. The PCB 510 is composed of a conductive member and an insulating member. The electrical conductive path 511 may be formed in a way to expose the conductive member of the PCB 510 by etching at least a part of the insulating member of the PCB 510.

The electrical conductive path 511 may be connected to a ground of the PCB 510. The electrical conductive path 511 may be formed symmetrically with the hole 503. The electrical conductive path 511 may be placed in the middle of the hole 503. The electrical conductive path 511 may be isolated from the microphone 520, may be isolated from the first surface 501, and may be disposed in the middle of the hole 503.

Figure 6:
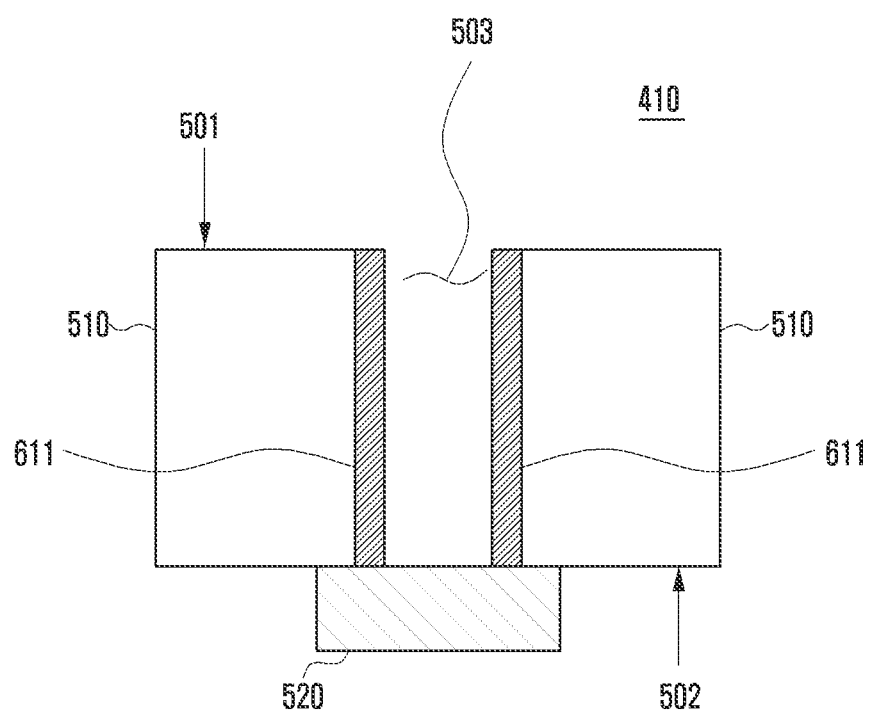
FIG. 6 is a diagram illustrating a cross-sectional view of a microphone according to an embodiment of the disclosure.

FIG. 6 is a diagram illustrating a cross-sectional view of a microphone module according to an embodiment of the disclosure.

Referring to FIG. 6, an electrical conductive path 611 of the microphone module 410 in FIG. 6 is different from the electrical conductive path 511 of the microphone module 410 in FIG. 5, and other elements thereof are the same as those of the electrical conductive path 511.

The PCB 510 may include the electrical conductive path 611. The electrical conductive path 611 may be formed in the entire hole 503 of the PCB 510.

The electrical conductive path 611 may be connected to the ground of the PCB 510. The electrical conductive path 611 may be formed in the entire region of a layer that forms the hole 503. The electrical conductive path 611 may be formed in the entire region of the hole 503 from the microphone 520 to the first surface 501 of the PCB 510.

The electrical conductive path 611 may be formed by plating and/or depositing a conductive material (e.g., copper) on the hole 503 of the PCB 510.

The electrical conductive path 611 may be formed by etching a part of the PCB 510.

Figure 7:
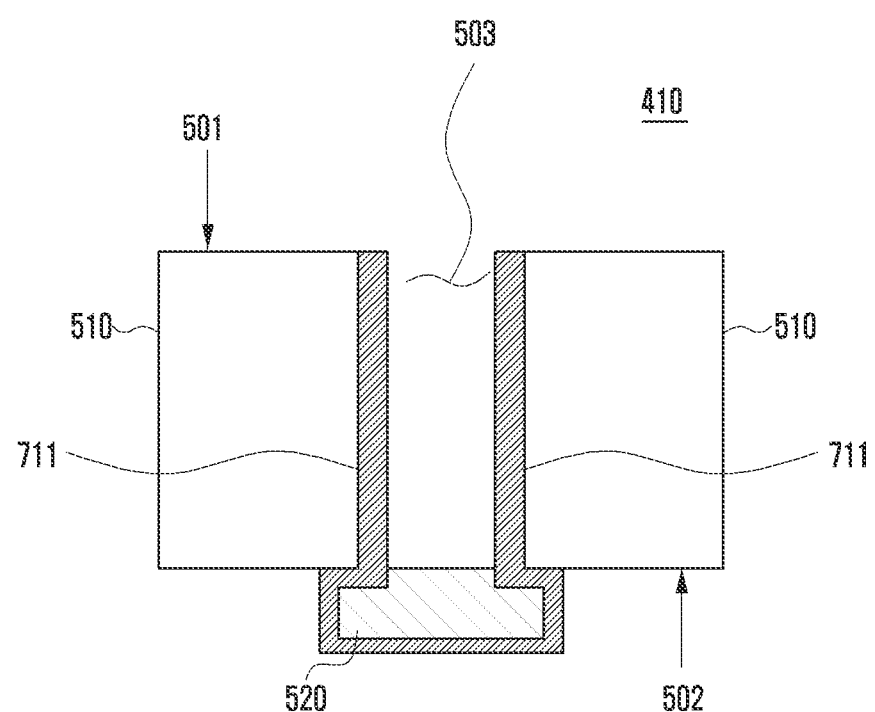
FIG. 7 is a diagram illustrating a cross-sectional view of a microphone according to an embodiment of the disclosure.

FIG. 7 is a diagram illustrating a cross-sectional view of a microphone module 410 according to an embodiment of the disclosure.

FIG. 7 further includes a characteristic in which the electrical conductive path 511 of the microphone module 410 in FIG. 5 is electrically connected to the microphone 520. The elements of FIG. 5 or 6 and 7 are the same.

Referring to FIG. 7, the PCB 510 may include an electrical conductive path 711. The electrical conductive path 711 may be formed in the entire hole 503 of the PCB 510, and may be electrically connected up to an outside (e.g., a protection member surrounding a microphone sensor and having conductivity) of the microphone 520.

The electrical conductive path 711 may be connected to the ground of the PCB 510. The electrical conductive path 711 may be connected to a ground of the microphone 520.

The electrical conductive path 711 may be connected to the ground of the PCB 510 and/or the ground of the microphone 520.

The electrical conductive path 711 may be connected to at least one of the ground of the PCB 510 or the ground of the microphone 520.

The electrical conductive path 711 may be formed in the entire region of the hole 503 from an outside (e.g., a protection member surrounding a microphone sensor and having conductivity) of the microphone 520 to the first surface 501 of the PCB 510.

The electrical conductive path 711 may be formed by plating and/or depositing a conductive material (e.g., copper) on the hole 503 of the PCB 510 and/or an outside (e.g., a protection member surrounding a microphone sensor and having conductivity) of the microphone 520.

An outside (e.g., a protection member surrounding a microphone sensor and having conductivity) of the microphone 520 may be made of a conductive material.

The electrical conductive path 711 may be formed by etching a part of the PCB 510.

Figure 8:
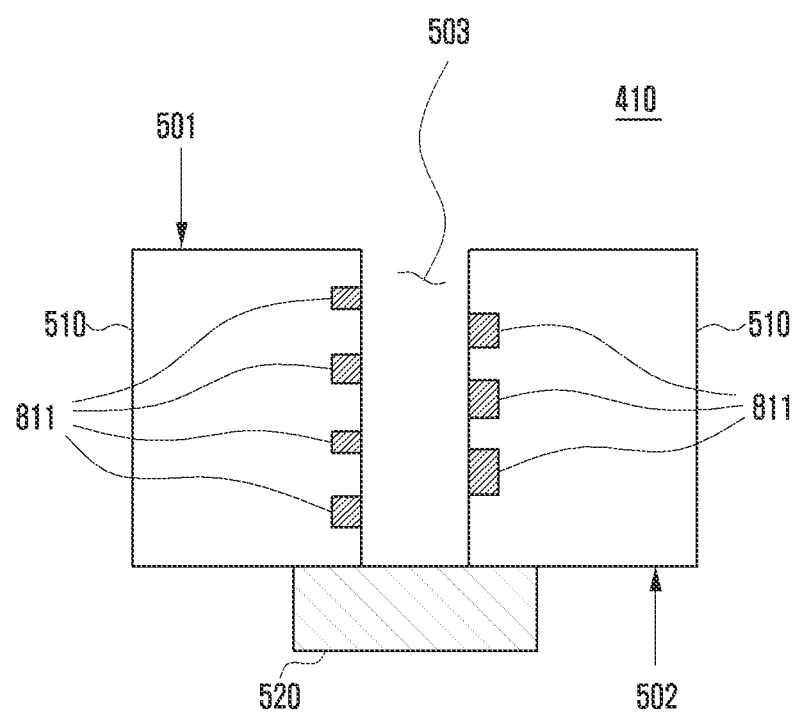
FIG. 8 is a diagram illustrating a cross-sectional view of a microphone according to an embodiment of the disclosure.

FIG. 8 is a diagram illustrating a cross-sectional view of a microphone module according to an embodiment of the disclosure.

Referring to FIG. 8, an electrical conductive path 811 of the microphone module 410 in FIG. 8 is different from the electrical conductive path 511 of the microphone module 410 in FIG. 5, and other elements are the same.

The PCB 510 may include the electrical conductive path 811. The electrical conductive path 811 may include a plurality of electrical conductive paths in the hole 503 of the PCB 510.

By plating and/or depositing a conductive material (e.g., copper) on at least one of a plurality of PCBs included in the PCB 510, the PCB 510 may include the electrical conductive path 811.

By etching at least one of a plurality of PCBs included in the PCB 510, the PCB 510 may include the electrical conductive path 811.

The electrical conductive path 811 may be connected to the ground of the PCB 510.

The electrical conductive path 811 may be distributed and disposed in the hole 503 of the PCB 510.

The electrical conductive path 811 may be disposed in a plurality of regions of the hole 503 of the PCB 510.

Figure 9:
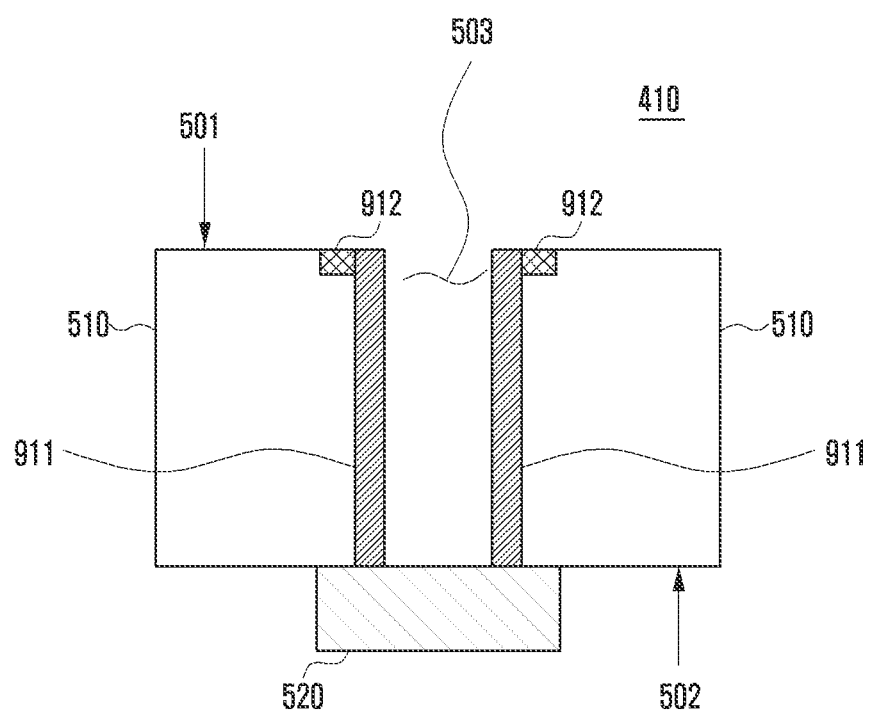
FIG. 9 is a diagram illustrating a cross-sectional view of a microphone according to an embodiment of the disclosure.

FIG. 9 is a diagram illustrating a cross-sectional view of a microphone module according to an embodiment of the disclosure.

Referring to FIG. 9, in an electrical conductive path 911 and 912, a surface electrical conductive path 912 is added to the electrical conductive path 611 in FIG. 6, and other elements are the same.

The PCB 510 may include an electrical conductive path 911. The electrical conductive path 911 may be formed in the entire hole 503 of the PCB 510.

The first surface 501 of the PCB 510 may be exposed to the outside. The surface electrical conductive path 912 may be formed in at least a part of the first surface 501 of the PCB 510.

The surface electrical conductive path 912 may be formed by plating and/or depositing a conductive material (e.g., copper) on a surface of a PCB disposed on the first surface 501 of the PCB 510.

The surface electrical conductive path 912 may be formed by etching a part of a surface of a PCB disposed on the first surface 501 of the PCB 510.

The first surface 501 of the PCB 510 may include an entrance of the hole 503. The surface electrical conductive path 912 of the PCB 510 may be formed around the entrance of the hole 503. The surface electrical conductive path 912 and the electrical conductive path 911 formed within the hole 503 may be electrically connected.

The electrical conductive path 911 may be connected to the ground of the PCB 510. The electrical conductive path 911 may be formed in the entire region of a layer that forms the hole 503. The electrical conductive path 911 may be formed in the entire region of the hole 503 from the microphone 520 to the first surface 501 of the PCB 510.

The electrical conductive path 911 may be formed by plating and/or depositing a conductive material (e.g., copper) on the hole 503 of the PCB 510.

In various embodiments, the electrical conductive path 911 may be formed by etching a part of the PCB 510.

Figure 10:
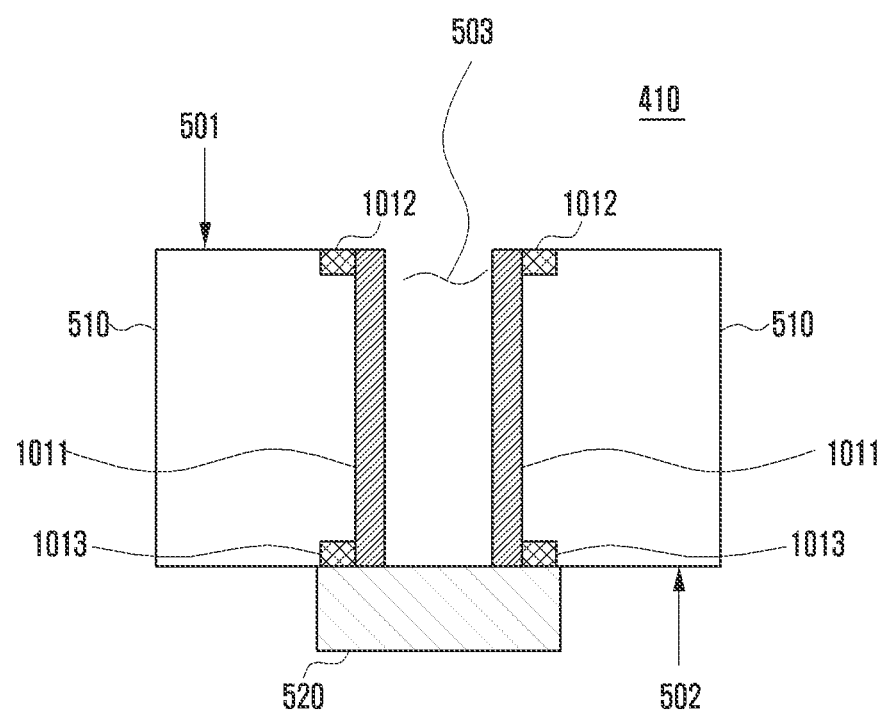
FIG. 10 is a diagram illustrating a cross-sectional view of a microphone according to an embodiment of the disclosure.

FIG. 10 is a diagram illustrating a cross-sectional view of a microphone module according to an embodiment of the disclosure.

Referring to FIG. 10, in an electrical conductive path 1011, 1012, and 1013, a surface electrical conductive path 1013 is added to the electrical conductive path 911 and 912 in FIG. 9, and other elements are the same.

The PCB 510 may include an electrical conductive path 1011. The electrical conductive path 1011 may be formed in the entire hole 503 of the PCB 510.

The first surface 501 of the PCB 510 may be exposed to the outside. A first surface electrical conductive path 1012 may be formed in at least a part of the first surface 501 of the PCB 510.

The second surface 502 of the PCB 510 may be exposed to the outside. A second surface electrical conductive path 1013 may be formed in at least a part of the second surface 502 of the PCB 510.

The first surface electrical conductive path 1012 may be formed by plating and/or depositing a conductive material (e.g., copper) on a surface of a PCB disposed on the first surface 501 of the PCB 510.

The first surface electrical conductive path 1012 may be formed by etching a part of a surface of a PCB disposed on the first surface 501 of the PCB 510.

The second surface electrical conductive path 1013 may be formed by plating and/or depositing a conductive material (e.g., copper) on a surface of a PCB disposed on the second surface 502 of the PCB 510.

The second surface electrical conductive path 1013 may be formed by etching a part of a surface of a PCB disposed on the second surface 502 of the PCB 510.

The first surface 501 of the PCB 510 and/or the second surface 502 may include an entrance (or exit) of the hole 503.

In the PCB 510, the first surface electrical conductive path 1012 may be formed around the entrance (or exit) of the hole 503, and the second surface electrical conductive path 1013 may be formed around the exit (or entrance). The PCB 510 may have the first surface electrical conductive path 1012, the second surface electrical conductive path 1013 and the electrical conductive path 1011 formed within the hole 503 electrically connected.

The electrical conductive path 1011 may be connected to the ground of the PCB 510. The electrical conductive path 1011 may be formed symmetrically with the hole 503. The electrical conductive path 1011 may be formed in the entire region of the hole 503 from the microphone 520 to the first surface 501 of the PCB 510.

The electrical conductive path 1011 may be formed by plating and/or depositing a conductive material (e.g., copper) on the hole 503 of the PCB 510.

In various embodiments, the electrical conductive path 1011 may be formed by etching a part of the PCB 510.

Figure 11:
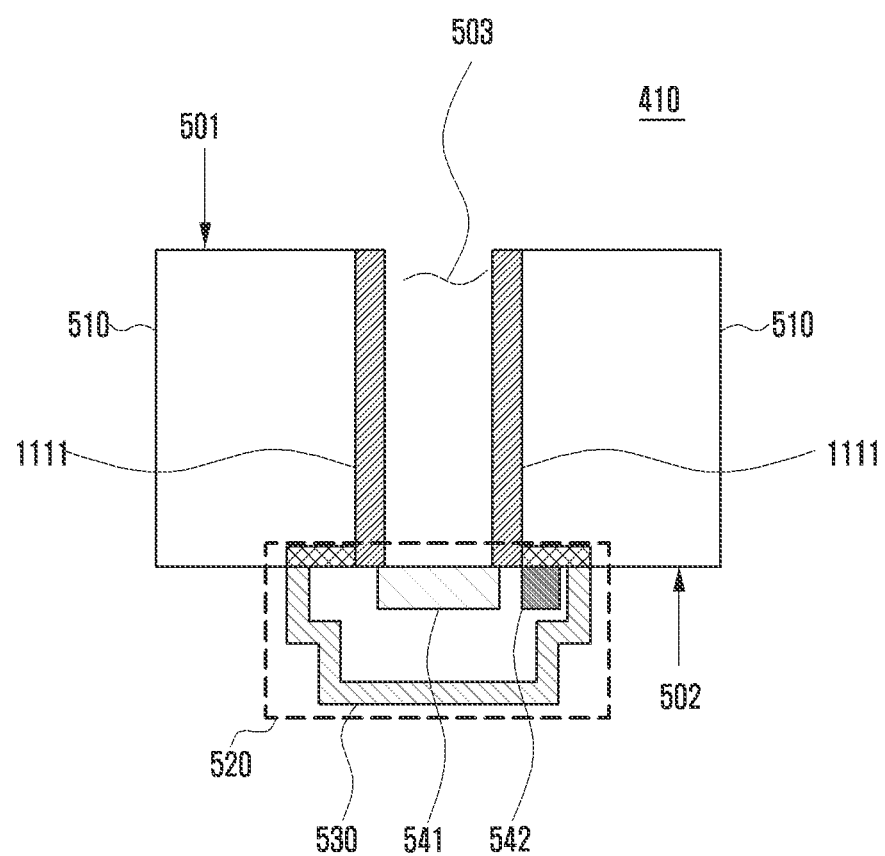
FIG. 11 is a diagram specifically illustrating a cross-sectional view of the microphone and the microphone module in FIG. 7 according to an embodiment of the disclosure.

FIG. 11 is a diagram specifically illustrating a cross-sectional view of a microphone module and the microphone of FIG. 7 according to an embodiment of the disclosure.

Referring to FIG. 11, the PCB 510 may include an electrical conductive path 1111. The electrical conductive path 1111 may be formed in the entire hole 503 of the PCB 510, and may be electrically connected up to a protection member 530 of the microphone 520. The protection member 530 may be a conductive and/or metal material.

The electrical conductive path 1111 may be connected to the ground of the PCB 510. The electrical conductive path 1111 may be connected to the ground of the microphone 520.

The microphone 520 may include a microphone sensor 541, an integrated circuit 542 and the protection member 530.

The microphone sensor 541 may have its capacitance changed based on a sound delivered through the hole 503, and may be mounted on at least a part of the second surface 502 of the PCB 510.

The integrated circuit 542 may be electrically connected to the microphone sensor 541, and may be mounted on at least a part of the second surface 520 of the PCB 510. The integrated circuit 542 may convert a change in capacitance of the microphone sensor 541 into an electrical signal.

The protection member 530 is a shielding and blocking structure, and may be connected to the ground of the microphone 520.

The electrical conductive path 1111 may be connected to the ground of the PCB 510 and/or the ground of the microphone 520.

The electrical conductive path 1111 may be connected to at least one of the ground of the PCB 510 or the ground of the microphone 520.

The electrical conductive path 1111 may be formed in the entire region of the hole 503 from an outside (e.g., the protection member 530) of the microphone 520 to the first surface 501 of the PCB 510.

The electrical conductive path 1111 may be formed by plating and/or depositing a conductive material (e.g., copper) on the hole 503 of the PCB 510 and/or an outside (e.g., the protection member 530) of the microphone 520.

An exterior (e.g., the protection member 530 of the microphone 520) of the microphone 520 may be composed of a conductive material.

The electrical conductive path 1111 may be formed by etching a part of the PCB 510.

Figure 12:
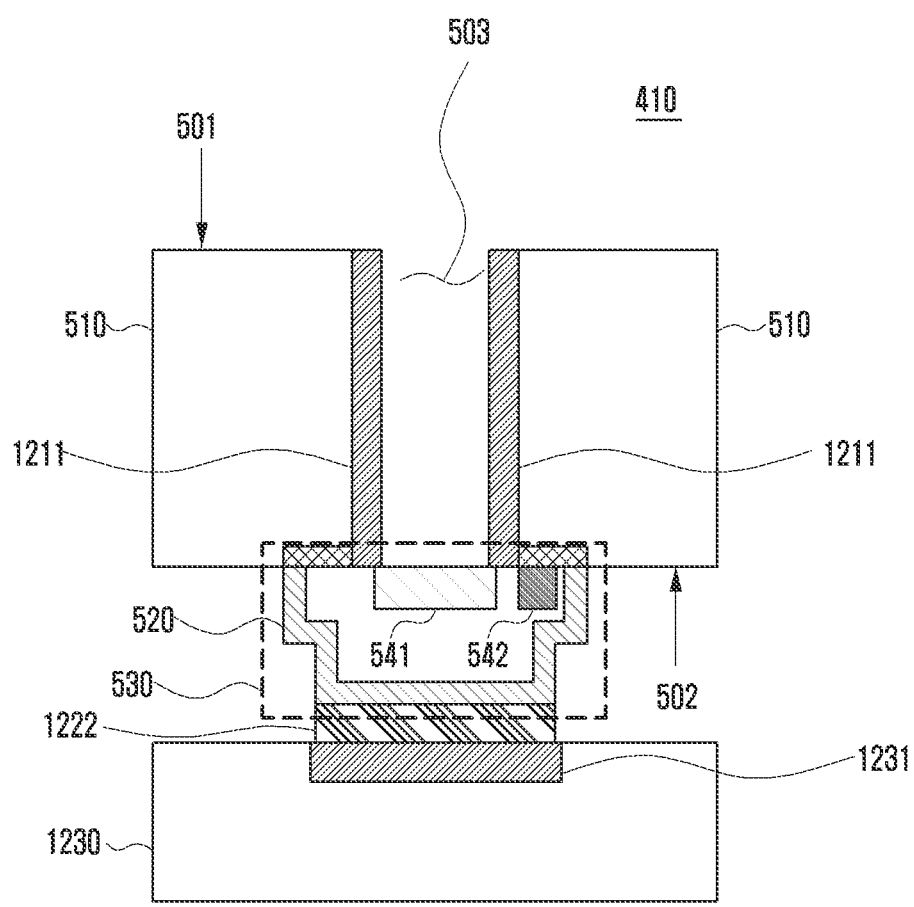
FIG. 12 is a diagram illustrating a cross-sectional view of a microphone according to an embodiment of the disclosure.

FIG. 12 is a diagram illustrating a cross-sectional view of a microphone module according to an embodiment of the disclosure.

Referring to FIG. 12, the microphone module 410 in FIG. 12 has a structure in which the microphone module 410 in FIG. 11 is connected to a ground 1231 of another PCB 1230.

The PCB 510 may include an electrical conductive path 1211. The electrical conductive path 1211 may be formed in the entire hole 503 of the PCB 510, and may be electrically connected up to the protection member 530.

The electrical conductive path 1211 may be connected to the ground of the PCB 510. The electrical conductive path 1211 may be connected to the ground of the microphone 520.

The microphone 520 may include the microphone sensor 541, the integrated circuit 542 and the protection member 530.

The capacitance of the microphone sensor 541 may change based on a sound delivered through the hole 503. The microphone sensor 541 may be mounted on the second surface 502 of the PCB 510.

The integrated circuit 542 may be electrically connected to the microphone sensor 541, and may be mounted on the second surface 520 of the PCB 510. The integrated circuit 542 may convert a change in capacitance of the microphone sensor 541 into an electrical signal.

The protection member 530 is a shielding and blocking structure, and may be connected to the ground of the microphone 520.

The electrical conductive path 1211 may be connected to the ground of the PCB 510 and/or the ground of the microphone 520.

The electrical conductive path 1211 may be connected to at least one of the ground of the PCB 510 or the ground of the microphone 520.

The electrical conductive path 1211 may be formed in the entire region of the hole 503 from an outside (e.g., the protection member 530) of the microphone 520 to the first surface 501 of the PCB 510.

The electrical conductive path 1211 may be formed by plating and/or depositing a conductive material (e.g., copper) on the hole 503 of the PCB 510 and/or an outside (e.g., the protection member 530) of the microphone 520.

An exterior (e.g., the protection member 530) of the microphone 520 may be composed of a conductive material.

The electrical conductive path 1211 may be formed by etching a part of the PCB 510.

The other PCB 1230 may be a main PCB, for example. The other PCB 1230 may include the ground 1231. The protection member 530 may be electrically connected to the ground 1231 of the other PCB 1230 through a conductive connection structure 1222.

The conductive connection structure 1222 is a conductive member, and may be one or more of a C-clip, a conductor and conductive sponge.

Figure 13:
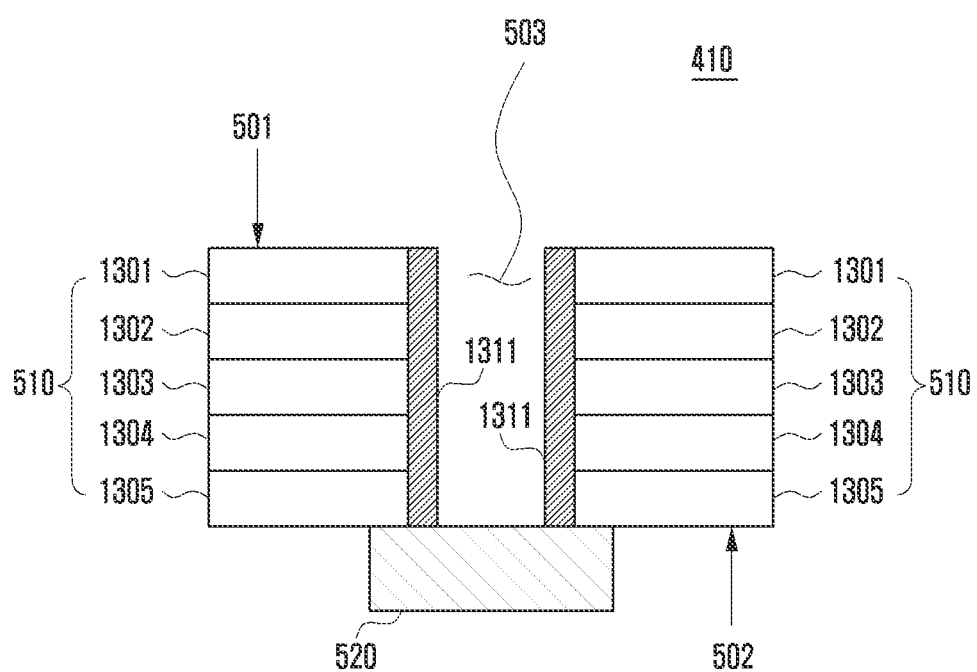
FIG. 13 is a diagram specifically illustrating a cross-sectional view of the microphone in FIG. 6 according to an embodiment of the disclosure.

FIG. 13 is a diagram specifically illustrating a cross-sectional view of a microphone module according to an embodiment of the disclosure.

Referring to FIG. 13, the PCB 510 may include a first PCB 1301, a second PCB 1302, a third PCB 1303, a fourth PCB 1304 and a fifth PCB 1305.

The first PCB 1301 may be disposed on the first surface 501 of the PCB 510, and the second PCB 1302, the third PCB 1303, the fourth PCB 1304, and the fifth PCB 1305 may be sequentially stacked thereon. The fifth PCB 1305 may be disposed on the second surface 502 of the PCB 510.

The PCB 510 may have the first PCB 1301, the second PCB 1302, the third PCB 1303, the fourth PCB 1304 and the fifth PCB 1305 stacked thereon.

Various embodiments disclose the PCB 510 on which five PCBs are stacked, but the disclosure is not limited thereto.

The PCB 510 may include an electrical conductive path 1311. The electrical conductive path 1311 may be formed in the entire hole 503 of the PCB 510.

The electrical conductive path 1311 may be connected to the ground of the PCB 510. The electrical conductive path 1311 may be formed symmetrically with the hole 503. The electrical conductive path 1311 may be formed in the entire region of the hole 503 from the microphone 520 to the first surface 501 of the PCB 510.

The first PCB 1301, the second PCB 1302, the third PCB 1303, the fourth PCB 1304 and the fifth PCB 1305 may form the electrical conductive path 1311 in a region neighboring the hole 503.

The electrical conductive path 1311 may be formed by plating and/or depositing a conductive material (e.g., copper) on the hole 503 of the PCB 510.

In various embodiments, the electrical conductive path 1311 may be formed by etching a part of the PCB 510.

Figure 14:
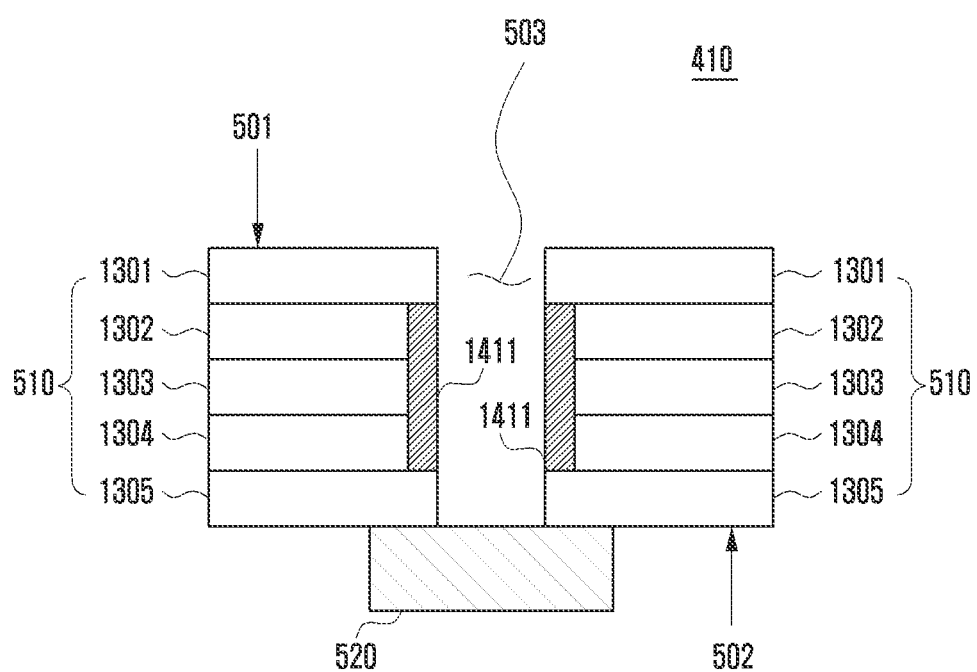
FIG. 14 is a diagram specifically illustrating a cross-sectional view of the microphone in FIG. 5 according to an embodiment of the disclosure.

FIG. 14 is a diagram specifically illustrating a cross-sectional view of a microphone module according to an embodiment of the disclosure.

Referring to FIG. 14, the PCB 510 may include a first PCB 1301, a second PCB 1302, a third PCB 1303, a fourth PCB 1304 and a fifth PCB 1305.

The PCB 510 may include an electrical conductive path 1411. The electrical conductive path 1411 may be formed in at least a part of the hole 503 of the PCB 510. The electrical conductive path 1411 may be formed by plating and/or depositing a conductive material (e.g., copper) on the hole 503 of the PCB 510.

The electrical conductive path 1411 may be formed by etching a part of the PCB 510. The PCB 510 may be composed of a conductive member and an insulating member. The electrical conductive path 1411 may be formed in a way to expose the conductive member of the PCB 510 by etching at least a part of the insulating member of the PCB 510.

The electrical conductive path 1411 may be connected to the ground of the PCB 510. The electrical conductive path 1411 may be formed symmetrically with the hole 503. The electrical conductive path 1411 may be placed in the middle of the hole 503. The electrical conductive path 1411 may be isolated from the microphone 520, may be isolated from the first surface 501, and may be disposed in the middle of the hole 503.

Among the first PCB 1301, the second PCB 1302, the third PCB 1303, the fourth PCB 1304 and the fifth PCB 1305, the second PCB 1302, the third PCB 1303 and the fourth PCB 1304 may form the electrical conductive path 1411 in a region neighboring the hole 503.

The electrical conductive path 1411 may be formed asymmetrically with the hole 503. The electrical conductive path 1411 may be formed in two layers on the left of the hole 503, and may be formed in three layers on the right of the hole 503. For example, the electrical conductive path 1411 may be formed in the second PCB 1302 and the third PCB 1303 on the left of the hole 503, and may be formed in the second PCB 1302, the third PCB 1303 and the fourth PCB 1304 on the right of the hole 503.

The electrical conductive path 1411 may be formed in three layers on the left of the hole 503, and may be formed in two layers on the right of the hole 503. For example, the electrical conductive path 1411 may be formed in the second PCB 1302, the third PCB 1303 and the fourth PCB 1304 on the left of the hole 503, and may be formed in the second PCB 1302 and the third PCB 1303 on the right of the hole 503.

Figure 15:
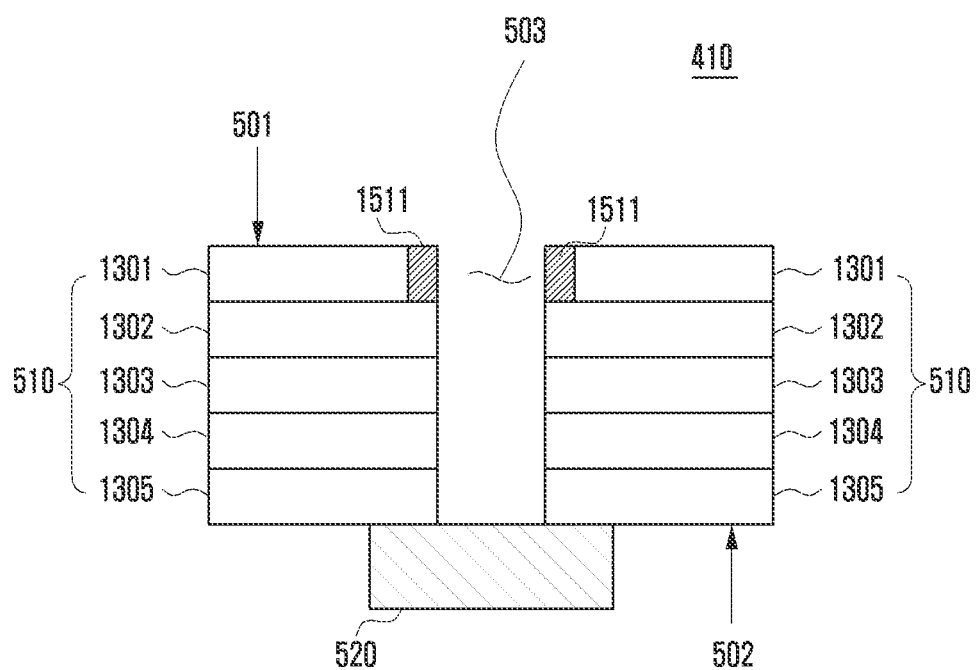
FIG. 15 is a diagram specifically illustrating a cross-sectional view of a microphone according to an embodiment of the disclosure.

FIG. 15 is a diagram specifically illustrating a cross-sectional view of a microphone module according to an embodiment of the disclosure.

Referring to FIG. 15, the PCB 510 may include a first PCB 1301, a second PCB 1302, a third PCB 1303, a fourth PCB 1304 and a fifth PCB 1305.

The PCB 510 may include an electrical conductive path 1511. The electrical conductive path 1511 may be formed in at least a part of a hole 503 of the PCB 510. The electrical conductive path 1511 may be formed by plating and/or depositing a conductive material (e.g., copper) on the hole 503 of the PCB 510.

The electrical conductive path 1511 may be formed by etching a part of the PCB 510. The PCB 510 may be composed of a conductive member and an insulating member. The electrical conductive path 1511 may be formed in a way to expose the conductive member of the PCB 510 by etching at least a part of the insulating member of the PCB 510.

The electrical conductive path 1511 may be connected to a ground of the PCB 510. The electrical conductive path 1511 may be formed symmetrically with the hole 503. The electrical conductive path 1511 may be isolated from a microphone 520, and may be disposed at an entrance (or exit) of the hole 503 in a way to neighbor the first surface 501.

Among the first PCB 1301, the second PCB 1302, the third PCB 1303, the fourth PCB 1304 and the fifth PCB 1305, the first PCB 1301 may form the electrical conductive path 1511 in a region neighboring the hole 503.

Figure 16:
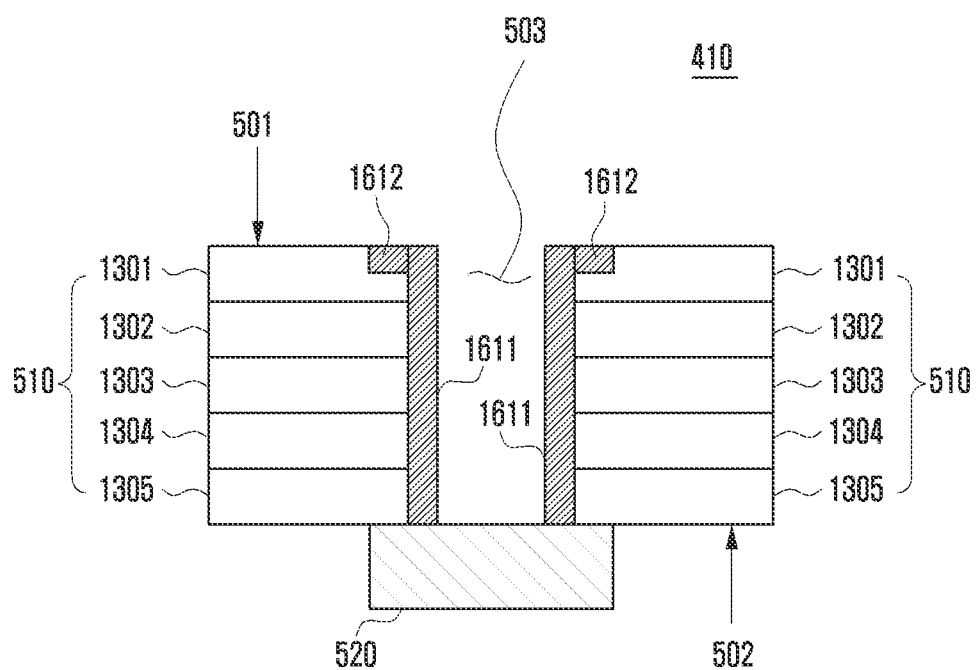
FIG. 16 is a diagram specifically illustrating a cross-sectional view of the microphone in FIG. 9 according to an embodiment of the disclosure.

FIG. 16 is a diagram specifically illustrating a cross-sectional view of a microphone module in FIG. 9 according to an embodiment of the disclosure.

Referring to FIG. 16, the PCB 510 may include a first PCB 1301, a second PCB 1302, a third PCB 1303, a fourth PCB 1304 and a fifth PCB 1305.

The PCB 510 may include an electrical conductive path 1611. The electrical conductive path 1611 may be formed in the entire hole 503 of the PCB 510.

The first PCB 1301, the second PCB 1302, the third PCB 1303, the fourth PCB 1304 and the fifth PCB 1305 may form the electrical conductive path 1611 in a region neighboring the hole 503.

The first surface 501 of the PCB 510 may be exposed to the outside. A surface electrical conductive path 1612 may be formed in at least a part of the first surface 501 of the PCB 510.

The surface electrical conductive path 1612 may be formed by plating and/or depositing a conductive material (e.g., copper) on a surface of a PCB disposed on the first surface 501 of the PCB 510.

The surface electrical conductive path 1612 may be formed by etching a part of a surface of a PCB disposed on the first surface 501 of the PCB 510.

The first surface 501 of the PCB 510 may include the entrance of the hole 503. The PCB 510 may have the surface electrical conductive path 1612 formed around the entrance of the hole 503, and may have the surface electrical conductive path 1612 and the electrical conductive path 1611 formed within the hole 503 electrically connected.

The electrical conductive path 1611 may be connected to the ground of the PCB 510. The electrical conductive path 1611 may be formed symmetrically with the hole 503. The electrical conductive path 16s11 may be formed in the entire region of the hole 503 from the microphone 520 to the first surface 501 of the PCB 510.

Figure 17:
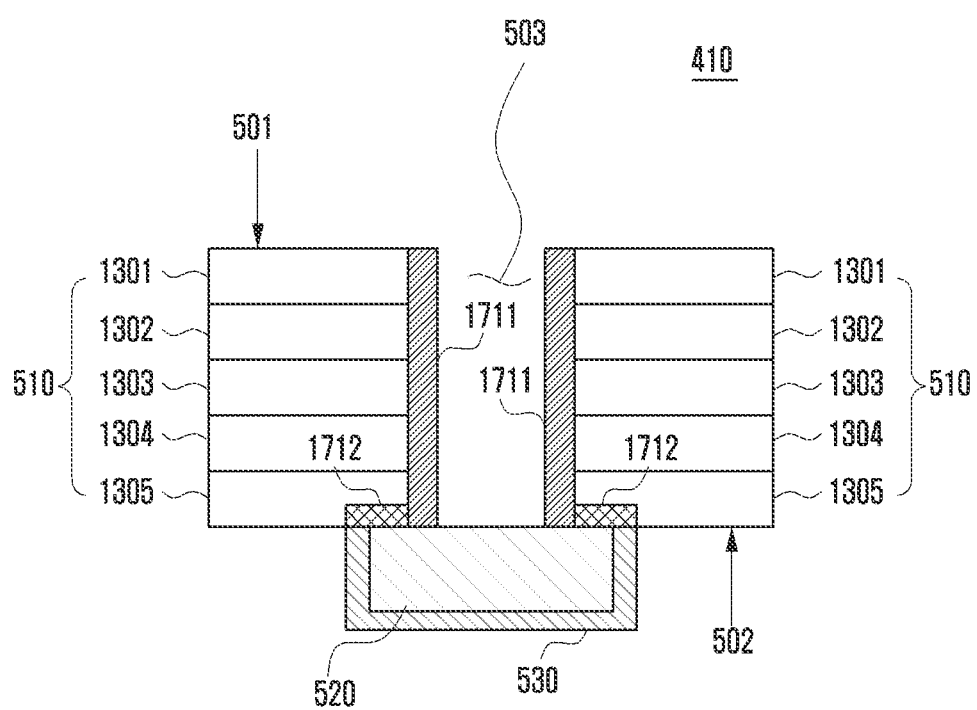
FIG. 17 is a diagram specifically illustrating a cross-sectional view of a microphone according to an embodiment of the disclosure.

FIG. 17 is a diagram specifically illustrating a cross-sectional view of a microphone module according to an embodiment of the disclosure.

Referring to FIG. 17, a characteristic in which the electrical conductive path in FIG. 13 is electrically connected to the microphone 520 may be added to the microphone module 410.

The PCB 510 may include the first PCB 1301, the second PCB 1302, the third PCB 1303, the fourth PCB 1304 and the fifth PCB 1305.

The PCB 510 may include an electrical conductive path 1711. The electrical conductive path 1711 may be formed in the entire hole 503 of the PCB 510.

The first PCB 1301, the second PCB 1302, the third PCB 1303, the fourth PCB 1304 and the fifth PCB 1305 may form the electrical conductive path 1711 in a region neighboring the hole 503.

The PCB 510 may include the electrical conductive path 1711. The electrical conductive path 1711 may be formed in the entire hole 503 of the PCB 510, and may be electrically connected up to the protection member 530.

The electrical conductive path 1711 may be connected to the ground of the PCB 510. The electrical conductive path 1711 may be connected to the ground of the microphone 520 through a printed circuit board (PCB) conductive path 1712.

In the PCB 510, the fifth PCB 1305 disposed on the second surface 502 may further include the PCB conductive path 1712.

The PCB conductive path 1712 may electrically connect the electrical conductive path 1711 and the protection member 530 of the microphone 520.

The electrical conductive path 1711 may be connected to the ground of the PCB 510 and/or the ground of the microphone 520.

The electrical conductive path 1711 may be connected to at least one of the ground of the PCB 510 or the ground of the microphone 520.

Figure 18:
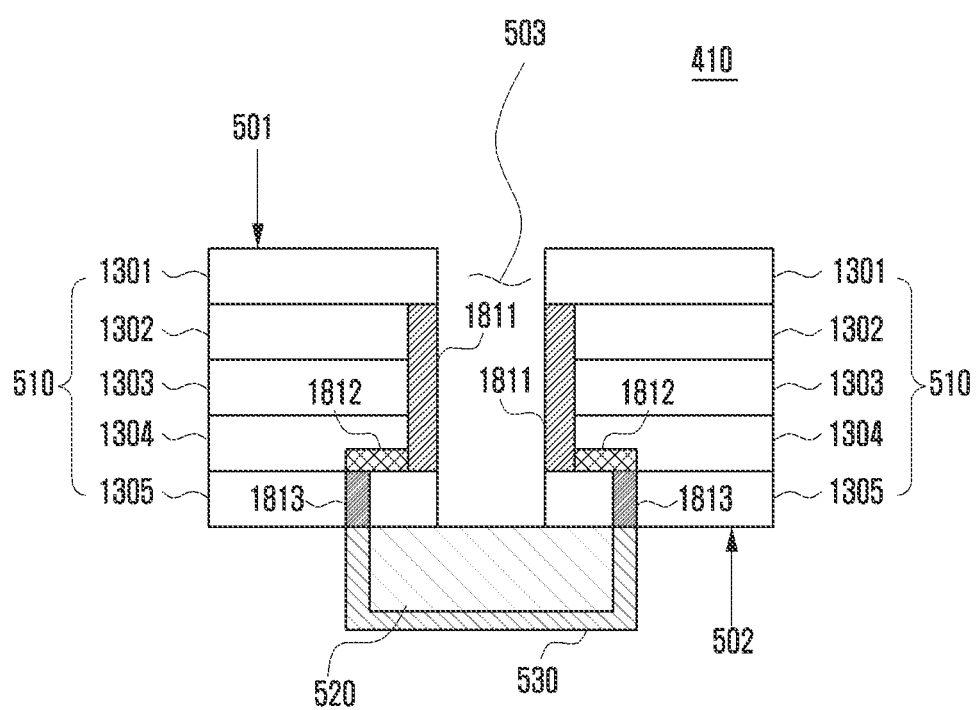
FIG. 18 is a diagram illustrating a cross-sectional view of a microphone according to an embodiment of the disclosure.

FIG. 18 is a diagram illustrating a cross-sectional view of a microphone module according to an embodiment of the disclosure.

Referring to FIG. 18, a characteristic in which the electrical conductive path in FIG. 14 is electrically connected to the microphone 520 may be added to the microphone module 410.

The PCB 510 may include the first PCB 1301, the second PCB 1302, the third PCB 1303, the fourth PCB 1304 and the fifth PCB 1305.

The PCB 510 may include an electrical conductive path 1811. The electrical conductive path 1811 may be formed in at least a part of the hole 503 of the PCB 510. The electrical conductive path 1811 may be formed by plating and/or depositing a conductive material (e.g., copper) on the hole 503 of the PCB 510.

In various embodiments, the electrical conductive path 1811 may be formed by etching a part of the PCB 510. The PCB 510 is composed of a conductive member and an insulating member. The electrical conductive path 1811 may be formed in a way to expose the conductive member of the PCB 510 by etching at least a part of the insulating member of the PCB 510.

The electrical conductive path 1811 may be connected to the ground of the PCB 510. The electrical conductive path 1811 may be formed symmetrically with the hole 503. The electrical conductive path 1811 may be placed in the middle of the hole 503. The electrical conductive path 1811 may be isolated from the microphone 520, may be isolated from the first surface 501, and may be disposed in the middle of the hole 503.

Among the first PCB 1301, the second PCB 1302, the third PCB 1303, the fourth PCB 1304 and the fifth PCB 1305, the second PCB 1302, the third PCB 1303 and the fourth PCB 1304 may form the electrical conductive path 1811 in a region neighboring the hole 503.

The electrical conductive path 1811 may be connected to the ground of the microphone 520 through at least one PCB conductive path 1812 and 1813.

The fourth PCB 1304 may include a first PCB conductive path 1812. The fifth PCB 1305 may include a second PCB conductive path 1813.

The at least one PCB conductive path 1812 and 1813 may electrically connect the electrical conductive path 1811 and a protection member 530 of the microphone 520.

The electrical conductive path 1811 may be connected to the ground of the PCB 510 and/or the ground of the microphone 520.

The electrical conductive path 1811 may be connected to at least one of the ground of the PCB 510 or the ground of the microphone 520.

Figure 19:
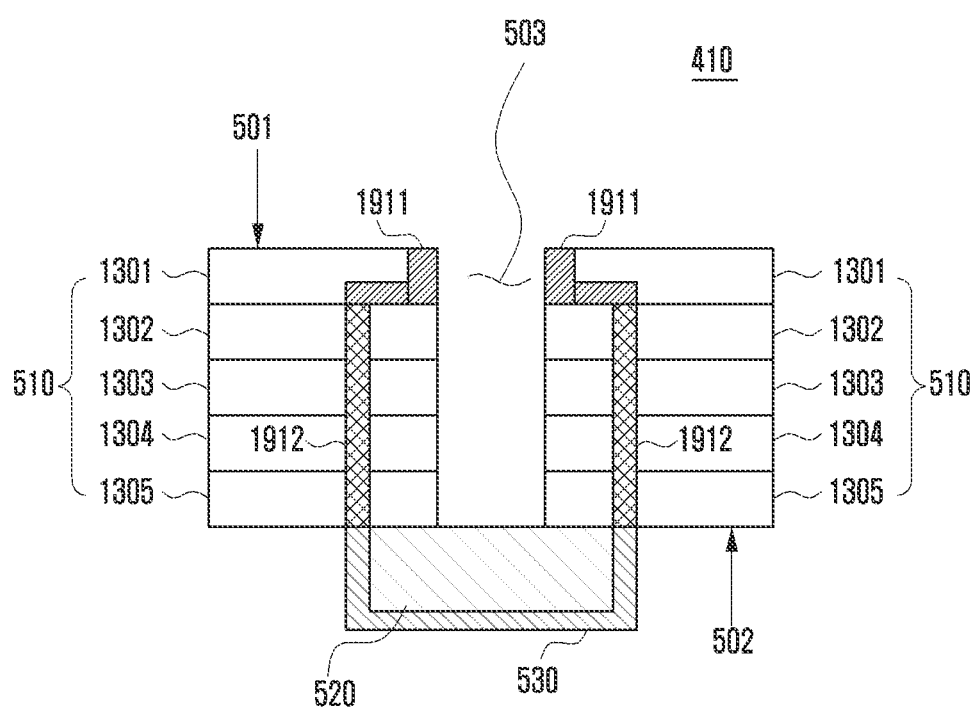
FIG. 19 is a diagram illustrating a cross-sectional view of a microphone according to an embodiment of the disclosure.

FIG. 19 is a diagram illustrating a cross-sectional view of a microphone module 410 according to an embodiment of the disclosure.

A characteristic in which the electrical conductive path in FIG. 15 is electrically connected to the microphone 520 may be added to the microphone module 410 in FIG. 19.

Referring to FIG. 19, an electrical conductive path 1911 may be connected to the ground of the PCB 510. The electrical conductive path 1911 may be formed symmetrically with the hole 503. The electrical conductive path 1911 may be isolated from the microphone 520, and may be disposed at the entrance (or exit) of the hole 503 in a way to neighbor the first surface 501.

Among the first PCB 1301, the second PCB 1302, the third PCB 1303, the fourth PCB 1304 and the fifth PCB 1305, the first PCB 1301 may form the electrical conductive path 1911 in a region neighboring the hole 503.

The electrical conductive path 1911 may be connected to the ground of the microphone 520 through at least one PCB conductive path 1912.

The at least one PCB conductive path 1912 may be formed in at least one of the first PCB 1301, the second PCB 1302, the third PCB 1303, the fourth PCB 1304 and the fifth PCB 1305.

The at least one PCB conductive path 1912 may electrically connect the electrical conductive path 1911 and the protection member 530 of the microphone 520.

The electrical conductive path 1911 may be connected to the ground of the PCB 510 and/or the ground of microphone 520.

The electrical conductive path 1911 may be connected to at least one of the ground of the PCB 510 or the ground of the microphone 520.

Figure 20:
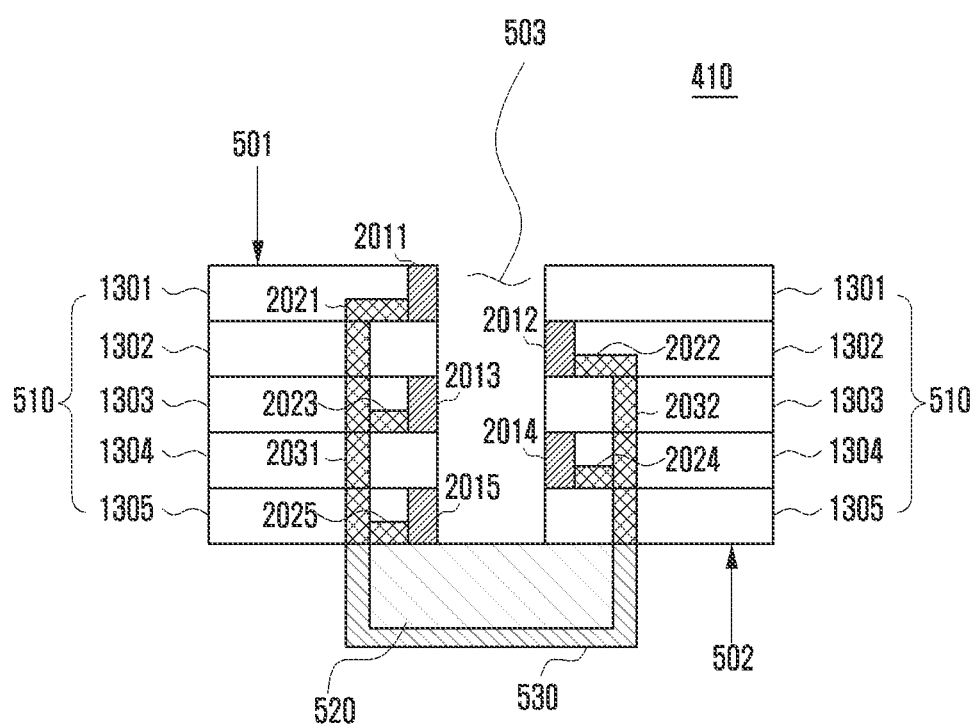
FIG. 20 is a diagram illustrating a cross-sectional view of a microphone according to an embodiment of the disclosure.

FIG. 20 is a diagram illustrating a cross-sectional view of a microphone module according to an embodiment of the disclosure.

A characteristic in which the electrical conductive path in FIG. 8 is electrically connected to the microphone 520 may be added to the microphone module 410 in FIG. 20.

Referring to FIG. 20, the PCB 510 may include a first PCB 1301, a second PCB 1302, a third PCB 1303, a fourth PCB 1304 and a fifth PCB 1305.

The PCB 510 may include a plurality of electrical conductive paths 2011, 2012, 2013, 2014 and 2015.

The plurality of electrical conductive paths 2011, 2012, 2013, 2014 and 2015 may be connected to the ground of the PCB 510.

The plurality of electrical conductive paths 2011, 2012, 2013, 2014 and 2015 may be distributed and disposed in the hole 503 of the PCB 510.

The plurality of electrical conductive paths 2011, 2012, 2013, 2014 and 2015 may be disposed in a plurality of regions of the hole 503 of the PCB 510.

At least a part of the first PCB 1301 may include the first electrical conductive path 2011. At least a part of the second PCB 1302 may include the second electrical conductive path 2012. At least a part of the third PCB 1303 may include the third electrical conductive path 2013. At least a part of the fourth PCB 1304 may include the fourth electrical conductive path 2014. At least a part of the fifth PCB 1305 may include the fifth electrical conductive path 2015.

The first electrical conductive path 2011 may be included in a region of the hole 503, which is formed by the first PCB 1301. The second electrical conductive path 2012 may be included in a region of the hole 503, which is formed by the second PCB 1302. The third electrical conductive path 2013 may be included in a region of the hole 503, which is formed by the third PCB 1303. The fourth electrical conductive path 2014 may be included in a region of the hole 503, which is formed by the fourth PCB 1304. The fifth electrical conductive path 2015 may be included in a region of the hole 503, which is formed by the fifth PCB 1305.

The first electrical conductive path 2011 to the fifth electrical conductive path 2015 are disposed in the respective PCBs, but may not be interconnected on a surface of the hole 503.

The plurality of electrical conductive paths 2011, 2012, 2013, 2014 and 2015 may be connected to the ground of the microphone 520 through at least one PCB conductive path 2021, 2022, 2023, 2024, 2025, 2031 and 2032.

The at least one PCB conductive path 2021, 2022, 2023, 2024, 2025, 2031 and 2032 may be formed in at least one of the first PCB 1301, the second PCB 1302, the third PCB 1303, the fourth PCB 1304 and the fifth PCB 1305.

The at least one PCB conductive path 2021, 2022, 2023, 2024, 2025, 2031 and 2032 may electrically connect the plurality of electrical conductive paths 2011, 2012, 2013, 2014 and 2015 and a protection member 530 of the microphone 520.

The plurality of electrical conductive paths 2011, 2012, 2013, 2014 and 2015 may be connected to the ground of the PCB 510 and/or the ground of the microphone 520.

The plurality of electrical conductive paths 2011, 2012, 2013, 2014 and 2015 may be connected to at least one of the ground of the PCB 510 or the ground of the microphone 520.

Figure 21:
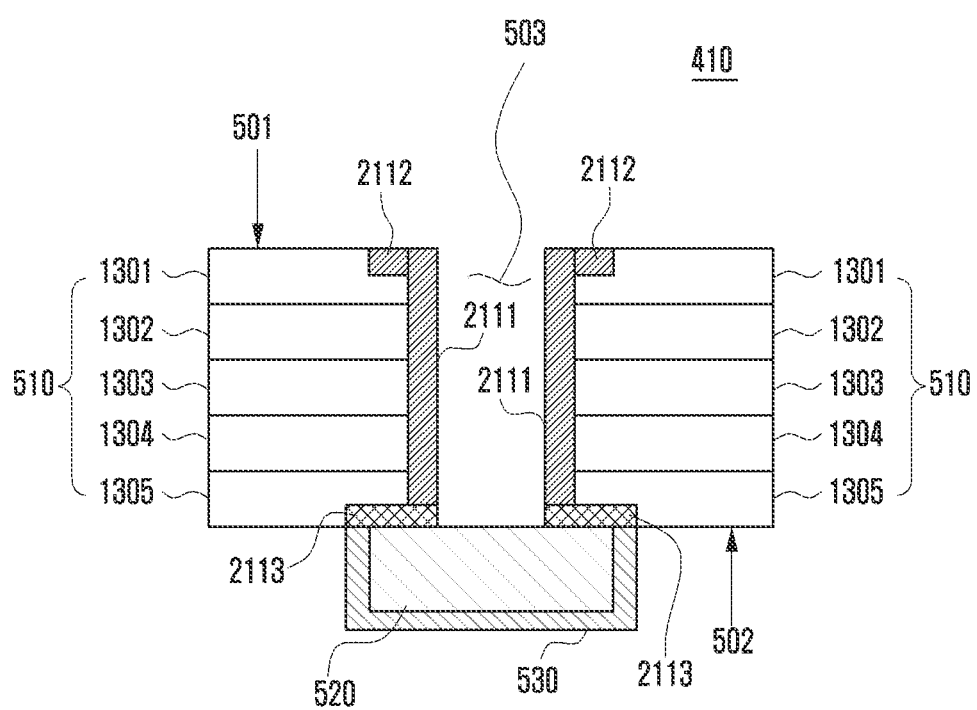
FIG. 21 is a diagram illustrating a cross-sectional view of a microphone according to an embodiment of the disclosure.

FIG. 21 is a diagram illustrating a cross-sectional view of a microphone module according to an embodiment of the disclosure.

A characteristic in which the electrical conductive path in FIG. 16 is electrically connected to the microphone 520 may be added to the microphone module 410 in FIG. 21.

Referring to FIG. 21, The PCB 510 may include the first PCB 1301, the second PCB 1302, the third PCB 1303, the fourth PCB 1304 and the fifth PCB 1305.

The PCB 510 may include an electrical conductive path 2111. The electrical conductive path 2111 may be formed in the entire hole 503 of the PCB 510.

The first PCB 1301, the second PCB 1302, the third PCB 1303, the fourth PCB 1304 and the fifth PCB 1305 may form the electrical conductive path 2111 in a region neighboring the hole 503.

The first surface 501 of the PCB 510 may be exposed to the outside. The surface electrical conductive path 2112 may be formed in the first surface 501 of the PCB 510.

The first surface 501 of the PCB 510 may include the entrance of the hole 503. The PCB 510 may form a surface electrical conductive path 2112 around the entrance of the hole 503, and may electrically connect the surface electrical conductive path 2112 and the electrical conductive path 2111 formed within the hole 503.

The electrical conductive path 2111 may be connected to the ground of the PCB 510.

The fifth PCB 1305 may include a PCB conductive path 2113.

The electrical conductive path 2111 may be connected to the ground of the microphone 520 through the PCB conductive path 2113.

The PCB conductive path 2113 may electrically connect the electrical conductive path 2111 and a protection member 530 of the microphone 520.

The electrical conductive path 2111 may be connected to the ground of the PCB 510 and/or the ground of the microphone 520.

The electronic device 101 according to various embodiments of the disclosure may include a PCB having a plurality of PCBs stacked thereon and including the hole 503 penetrating the plurality of PCBs; the microphone 520 disposed on a first surface (e.g., the second surface 502 in FIG. 5) of the PCB and to which a sound is delivered through the hole 503; and an electrical conductive path formed in at least a part of or the entire hole 503. The electrical conductive path may be electrically connected to at least one of the ground of the PCB or the ground of the microphone 520.

The microphone 520 according to various embodiments of the disclosure may include the microphone sensor 541 and the protection member 530 shielding the microphone sensor 541. The protection member 530 may be connected to the ground of the microphone 520.

The microphone sensor 541 according to various embodiments of the disclosure may be an MEMS acoustic transducer, and may sense a change in capacitance according to a sound. The microphone 520 may further include an integrated circuit for converting a change in the capacitance into an electrical signal.

The PCB according to various embodiments of the disclosure may include a first surface (e.g., the second surface 502 in FIG. 5) on which the microphone 520 is disposed and a second surface (e.g., the first surface 501 in FIG. 5) toward the outside. The electrical conductive path may be formed in the entire interior of the hole 503 penetrating the second surface from the first surface (e.g., the second surface 502 in FIG. 5).

The electrical conductive path according to various embodiments of the disclosure may be isolated from the first surface (e.g., the second surface 502 in FIG. 5) and the second surface, and may be formed in at least a part of a surface of the hole 503.

The electrical conductive path according to various embodiments of the disclosure may neighbor the second surface (e.g., the first surface 501 in FIG. 5), may be isolated from the first surface (e.g., the second surface 502 in FIG. 5), and may be formed in at least a part of a surface of the hole 503.

The electrical conductive path according to various embodiments of the disclosure may form a plurality of electrical conductive paths in some region of the hole 503 in the plurality of PCBs, respectively. Each of the plurality of electrical conductive paths may be isolated from the surface of the hole 503.

The second surface (e.g., the first surface 501 in FIG. 5) according to various embodiments of the disclosure may further include a first surface electrical conductive path electrically connected to the electrical conductive path.

The first surface (e.g., the second surface 502 in FIG. 5) according to various embodiments of the disclosure may further include a second surface electrical conductive path electrically connected to the electrical conductive path.

The PCB according to various embodiments of the disclosure may further include at least one PCB conductive path electrically connected to the electrical conductive path. The at least one PCB conductive path may be electrically connected to a ground of the microphone 520.

The electronic device 101 according to various embodiments of the disclosure may further include a buffer member disposed on the second surface (e.g., the first surface 501 in FIG. 5), and the camera window 200 disposed on the buffer member.

The second surface (e.g., the first surface 501 in FIG. 5) according to various embodiments of the disclosure may be coupled with the camera assembly 210.

The camera assembly according to various embodiments of the disclosure may include a microphone (520) hole corresponding to the hole 503, and may include a microphone (520) coupling structure corresponding to the stacked PCBs.

The PCB according to various embodiments of the disclosure may include a board on which the plurality of PCBs is stacked; the hole 503 penetrating the board; an electrical conductive path formed in at least a part of or the entire hole 503; and a ground formed in the board. The electrical conductive path may be electrically connected to the ground.

The PCB according to various embodiments of the disclosure may further include the microphone 520 disposed on the first surface (e.g., the second surface 502 in FIG. 5) of the board and to which a sound is delivered through the hole 503.

The microphone 520 according to various embodiments of the disclosure may include the microphone sensor 541 and the protection member 530 shielding the microphone sensor 541. The protection member 530 may be connected to the ground.

The board according to various embodiments of the disclosure may include the first surface (e.g., the second surface 502 in FIG. 5) and the second surface (e.g., the first surface 501 in FIG. 5) toward the outside. The electrical conductive path may be formed in the entire interior of the hole 503 penetrating the second surface (e.g., the first surface 501 in FIG. 5) from the first surface (e.g., the second surface 502 in FIG. 5).

The electrical conductive path according to various embodiments of the disclosure may be isolated from the first surface (e.g., the second surface 502 in FIG. 5) and the second surface (e.g., the first surface 501 in FIG. 5), and may be formed in at least some of a surface of the hole 503.

The electrical conductive path according to various embodiments of the disclosure may neighbor the second surface (e.g., the first surface 501 in FIG. 5), may be isolated from the first surface, and may be formed in at least some of a surface of the hole 503.

The PCB according to various embodiments of the disclosure may include at least one of a first surface electrical conductive path electrically connected to the electrical conductive path and disposed on the first surface (e.g., the second surface 502 in FIG. 5); and a second surface electrical conductive path electrically connected to the electrical conductive path and disposed on the second surface (e.g., the first surface 501 in FIG. 5).

The electronic device according to various embodiments disclosed in this document may be various types of devices. The electronic device may include a portable communication device (e.g., smartphone), a computer device, a portable multimedia device, a portable medical device, a camera, a wearable device, or home appliances, for example. The electronic device according to various embodiments of this document is not limited to the aforementioned devices.

The various embodiments disclosed herein and terms used are not intended to limit the technical characteristics, described in this document, to specific embodiments, and should be understood as including various changes, equivalents or alternatives of a corresponding embodiment. In relation to the description of the drawings, similar reference numerals may be used for similar or related elements. A singular form of a noun corresponding to an item may include one item or a plurality of items unless explicitly described otherwise in the context. In this document, each of phrases, such as "A or B", "at least one of A and B", "at least one of A or B", "A, B or C," "at least one of A, B and C", and "at least one of A, B, or C", may include any one of items listed along with a corresponding one of the phrases or all possible combinations of the listed items. Terms, such as a "first", a "second", or "the first" or "the second", may be used to merely distinguish between a corresponding element and another corresponding element, and do not limit corresponding elements in another aspect (e.g., importance or sequence). If any (e.g., first) element is described as being "coupled" or "connected" to another (e.g., a second) element along with a term "functionally" or "communicatively" or without such a term, this means that the any element may be coupled to the other element directly (e.g., in a wired way), wirelessly, or through a third element.

The term "module" used in this document may include a unit implemented as hardware, software or firmware, and may be interchangeably used with a term, such as logic, a logical block, a part, or a circuit. The module may be an integrated part, or a minimum unit of the part or a part thereof, which performs one or more functions. For example, according to an embodiment, the module may be implemented in the form of an application-specific integrated circuit (ASIC).

The various embodiments of this disclosure may be implemented as software (e.g., the program 140) including one or more instructions stored in a storage medium (e.g., the embedded memory 136 or the external memory 138) readable by a machine (e.g., the electronic device 101). For example, a processor (e.g., the processor 120) of a machine (e.g., the electronic device 101) may invoke at least one of the one or more instructions stored in the storage medium, and may execute the instruction. This enables the machine to operate to perform at least one function based on the invoked at least one instruction. The one or more instructions may include a code generated by a complier or a code executable by an interpreter. The machine-readable storage media may be provided in the form of a non-transitory storage medium. In this case, "non-transitory" merely means that the storage medium is a tangible device and does not include a signal (e.g., electromagnetic wave). The term does not distinguish between a case where data is semi-permanently stored in the storage medium and a case where data is temporally stored in the storage medium.

The method according to various embodiments disclosed herein may be included in a computer program product and provided. The computer program product may be traded as a product between a seller and a purchaser. The computer program product may be distributed in the form of a machine-readable storage medium (e.g., a compact disc read only memory (CD-ROM)) or may be distributed through an app store (e.g., PlayStore™) or directly between two user devices (e.g., smartphones) or online (e.g., download or upload). In the case of the online distribution, at least some of the computer program products may be at least temporarily stored or provisionally generated in a machine-readable storage medium, such as the memory of the server of a manufacturer, the server of an app store or a relay server.

According to various embodiments, each (e.g., module or program) of the described elements may include a single entity or a plurality of entities. According to various embodiments, one or more elements or operations of the aforementioned elements may be omitted or one or more other elements or operations may be added. Alternatively or additionally, a plurality of elements (e.g., modules or programs) may be integrated into a single element. In such a case, the integrated element may perform a function performed by a corresponding one of the plurality of elements before at least one function of each of the plurality of elements is integrated identically or similarly. According to various embodiments, operations performed by a module, a program or another element may be executed sequentially, in parallel, iteratively or heuristically, or one or more of the operations may be executed in different order or may be omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
a multi layered printed circuit board (PCB) comprising a plurality of PCBs arranged in a stack, the multi layered PCB further comprising a hole penetrating the plurality of PCBs;
a microphone disposed on a first surface of the multi layered PCB, a sound being delivered from outside the electronic device to the microphone through the hole penetrating the plurality of PCBs; and
an electrical conductive path formed in at least a part of the hole, the electrical conductive path extending along a surface layer forming the hole in a direction in which the hole penetrates the plurality of PCBs,
wherein the electrical conductive path is electrically connected to at least one of a ground of the multi layered PCB or a ground of the microphone.

2. The electronic device of claim 1,
wherein the microphone comprises:
a microphone sensor; and
a protection member shielding the microphone sensor, and
wherein the protection member is connected to the ground of the microphone.

3. The electronic device of claim 2,
wherein the microphone sensor comprises a micro electromechanical system (MEMS) acoustic transducer and senses a change in capacitance according to the sound, and
wherein the microphone further comprises an integrated circuit configured to convert the change in the capacitance into an electrical signal.

4. The electronic device of claim 1,
wherein the multi layered PCB comprises the first surface on which the microphone is disposed and a second surface opposite to the first surface and facing in a direction toward the outside, and wherein the electrical conductive path is formed in an entire region of the surface layer forming the hole penetrating the plurality of PCBs from the second surface to the first surface.

5. The electronic device of claim 4, wherein the second surface comprises a first surface electrical conductive path electrically connected to the electrical conductive path.

6. The electronic device of claim 5, wherein the first surface comprises a second surface electrical conductive path electrically connected to the electrical conductive path.

7. The electronic device of claim 4,
wherein the multi layered PCB further comprises at least one PCB conductive path electrically connected to the electrical conductive path, and
wherein the at least one PCB conductive path is electrically connected to the ground of the microphone.

8. The electronic device of claim 4, further comprising:
a buffer member disposed on the second surface; and
a camera window disposed on the buffer member.

9. The electronic device of claim 4, wherein the second surface is coupled with a camera assembly.

10. The electronic device of claim 9, wherein the camera assembly comprises:
a microphone hole corresponding to the hole; and
a microphone coupling structure having a shape corresponding to a shape of the second surface of the multi layered PCB.

11. The electronic device of claim 1,
wherein the electrical conductive path is isolated from the first surface and a second surface of the multi layered PCB opposite to the first surface and facing in a direction toward the outside, and
wherein the electrical conductive path is formed in at least a part of the surface layer forming the hole penetrating the plurality of PCBs from the second surface to the first surface.

12. The electronic device of claim 1,
wherein the electrical conductive path neighbors a second surface of the multi layered PCB opposite to the first surface and facing in a direction toward the outside,
wherein the electrical conductive path is isolated from the first surface, and
wherein the electrical conductive path is formed in at least a part of the surface layer forming the hole penetrating the plurality of PCBs from the second surface to the first surface.

13. The electronic device of claim 1,
wherein the electrical conductive path forms a plurality of electrical conductive paths in a region of the hole in the plurality of PCBs, respectively, and
wherein the plurality of electrical conductive paths are isolated from one another in the surface layer forming the hole penetrating the plurality of PCBs from the first surface to a second surface opposite to the first surface and facing in a direction toward the outside.

14. A printed circuit board (PCB) comprising:
a board comprising a plurality of PCBs arranged in a stack;
a hole penetrating the board and the plurality of PCBs;
an electrical conductive path formed in at least a part of the hole, the electrical conductive path extending along a surface layer forming the hole in a direction in which the hole penetrates the plurality of PCBs; and
a ground formed in the board,
wherein the electrical conductive path is electrically connected to the ground.

15. The PCB of claim 14, further comprising:
a microphone disposed on a first surface of the board,
wherein a sound is delivered from outside to the microphone through the hole penetrating the board and the plurality of PCBs.

16. The PCB of claim 15,
wherein the microphone comprises:
a microphone sensor; and
a protection member shielding the microphone sensor, and
wherein the protection member is connected to the ground.

17. The PCB of claim 15,
wherein the board comprises the first surface and a second surface opposite to the first surface and facing a direction toward the outside, and
wherein the electrical conductive path is formed in an entire region of the surface layer forming the hole penetrating the board and the plurality of PCBs from the second surface to the first surface.

18. The PCB of claim 17,
wherein the electrical conductive path neighbors the second surface,
wherein the electrical conductive path is isolated from the first surface, and
wherein the electrical conductive path is formed in at least a part of the surface layer forming the hole penetrating the board and the plurality of PCBs from the second surface to the first surface.

19. The PCB of claim 17, further comprising:
a first surface electrical conductive path electrically connected to the electrical conductive path and disposed on the first surface; and
a second surface electrical conductive path electrically connected to the electrical conductive path and disposed on the second surface.

20. The PCB of claim 15,
wherein the electrical conductive path is isolated from the first surface and a second surface of the board opposite to the first surface and facing a direction toward the outside, and
wherein the electrical conductive path is formed in at least a part of the surface layer forming the hole penetrating the board and the plurality of PCBs from the second surface to the first surface.

* * * * *